United States Patent
Wang et al.

(10) Patent No.: US 11,592,533 B2
(45) Date of Patent: Feb. 28, 2023

(54) MEMS MIRROR STRUCTURE WITH BACKSIDE SKELETON

(71) Applicant: Beijing Voyager Technology Co., Ltd., Beijing (CN)

(72) Inventors: Youmin Wang, Mountain View, CA (US); Yufeng Wang, Mountain View, CA (US); Qin Zhou, Livermore, CA (US); Gary Li, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 226 days.

(21) Appl. No.: 16/905,489

(22) Filed: Jun. 18, 2020

(65) Prior Publication Data
US 2021/0396852 A1    Dec. 23, 2021

(51) Int. Cl.
*G02B 26/00*    (2006.01)
*G01S 7/481*    (2006.01)
*G02B 26/10*    (2006.01)
*B81B 3/00*    (2006.01)
*G01S 17/02*    (2020.01)

(52) U.S. Cl.
CPC .......... *G01S 7/4817* (2013.01); *B81B 3/0035* (2013.01); *G02B 26/101* (2013.01); *B81B 2201/047* (2013.01); *G01S 17/02* (2013.01)

(58) Field of Classification Search
CPC ..... G01S 7/4817; G01S 17/02; B81B 3/0035; B81B 2201/047; G02B 26/101
USPC ......... 359/212.1, 212.2, 213.1, 214.1, 223.1, 359/224.1, 290, 298; 356/4.01
See application file for complete search history.

(56) References Cited

U.S. PATENT DOCUMENTS

| 6,170,332 | B1 | 1/2001 | MacDonald et al. |
| 2003/0019832 | A1 | 1/2003 | Conant et al. |
| 2005/0218506 | A1* | 10/2005 | Geisler .................. H05K 3/246 |
| | | | 257/703 |
| 2011/0149361 | A1* | 6/2011 | Moidu ............... G02B 26/0841 |
| | | | 29/622 |
| 2014/0230547 | A1 | 8/2014 | El-Gamal et al. |

(Continued)

OTHER PUBLICATIONS

Non-Final Office Action for U.S. Appl. No. 16/905,496 , dated Oct. 13, 2022, 14 pages.

*Primary Examiner* — William Choi
(74) *Attorney, Agent, or Firm* — Kilpatrick Townsend & Stockton LLP

(57) ABSTRACT

A Light Detection and Ranging (LiDAR) module for a vehicle can include a semiconductor integrated circuit with a microelectromechanical system (MEMS) and a substrate, the MEMS comprising a micro-mirror assembly including a mirror and a gimbal structure. The gimbal can be configured concentrically around and coplanar with the mirror. When rotated, the gimbal drives the mirror to oscillate at or near a resonant frequency and is coupled to the mirror via mirror-gimbal connectors. A support structure can be coupled to a backside of the mirror and gimbal structures and can increase the stiffness of the mirror to help the mirror better resist dynamic deformation. To limit the added rotational moment of inertia, the support structure can be etched to form a matrix of cells (e.g., formed by a mesh of circumferential and radial ridges) such that up to approximately 90% of the support structure material forming the support structure is removed.

20 Claims, 16 Drawing Sheets

(56) References Cited

U.S. PATENT DOCUMENTS

2019/0293923 A1    9/2019  Ghahremani et al.
2020/0386985 A1\*  12/2020  Liukku ................ G01S 7/4817

\* cited by examiner

MEMS MIRROR STRUCTURE WITH BACKSIDE SKELETON

BACKGROUND

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals. A micro-mirror assembly typically includes a micro-mirror and an actuator. In a micro-mirror assembly, a mirror-mirror can be connected to a substrate via a connection structure (e.g., a torsion bar, a spring, etc.) to form a pivot point. One such type of micro-mirror assembly can be a micro-electromechanical system (MEMS)-type structure that may be used for a light detection and ranging (LiDAR) system in an autonomous vehicle, which can be configured for detecting objections and determining their corresponding distances from the vehicle. LiDAR systems typically work by illuminating a target with an optical pulse and measuring the characteristics of the reflected return signal. The return signal is typically captured as a point cloud. The width of the optical-pulse often ranges from a few nanoseconds to several microseconds.

The performance of a MEMS micro-mirror structure directly affects the quality of the point cloud and the image. To increase the detection range of a LiDAR system, a large aperture is often preferred, which can increase the moment of inertia of the micro-mirror. However, large aperture MEMS micro-mirrors can be prone to larger dynamic deformation, which may cause a large divergence of a corresponding light spot and reduce the image resolution. Furthermore, high resolution imaging requires a high resonant frequency of the MEMS system. Large apertures and high resolution often require springs with higher stiffness and a larger driving force to maintain a predetermined amplitude of a particular mirror deflection angle. This can markedly increase the power requirement of the system, which is generally not preferred. These engineering tradeoffs can present significant challenges in contemporary designs and solutions to overcome these challenges are needed.

BRIEF SUMMARY

In some embodiments, a Light Detection and Ranging (LiDAR) module for a vehicle can include a semiconductor integrated circuit including a microelectromechanical system (MEMS) and a substrate, the MEMS comprising a micro-mirror assembly including a mirror and a gimbal coupled to the mirror. The gimbal may be configured concentrically around and coplanar with the mirror, and when rotated, the gimbal may drive the mirror to oscillate at approximately a resonant frequency. The micro-mirror assembly can include a support structure coupled to a backside of the mirror, the support structure configured to increase a stiffness of the mirror, the support structure being etched to form a matrix of cells such that at least 50% of support structure material forming the support structure is removed. In some cases, a second support structure is coupled to a backside of the gimbal, the second support structure configured to increase the stiffness of the gimbal, the second support structure being etched to form a second matrix of cells such that at least 50% of second support structure material is removed.

In certain embodiments, the cells can have a pitch between 100 µm-800 µm. The pitch may refer to a distance between circumferential and/or radial ridges the form the structure of the cells. In some cases, the support structure may be etched such that between 50%-90% of the support structure material is removed, although higher and lower amounts are possible. The mirror and the gimbal may form an elliptical structure, although other polygonal shapes are possible, such as circles, squares, rectangles, etc. The micro-mirror assembly can include at least two torsion springs coupled to diametrically opposed ends of the gimbal, wherein the torsion springs are configured to apply a rotational force that causes the gimbal to rotate at the resonant frequency. In some implementations, the mirror and the support structure can be shaped as an ellipse having a center point and an outer edge, wherein a center region of the support structure is not etched, and wherein the center region is defined by a concentric ellipse with a radius at each point along an outer edge of the concentric ellipse that is less than 50% of a distance between the center point and the outer edge of the mirror.

In certain embodiments, an apparatus includes a semiconductor integrated circuit including a microelectromechanical system (MEMS) and a substrate, the MEMS comprising a micro-mirror assembly including a mirror and a support structure forming a backside of the mirror, the support structure configured to increase a stiffness of the mirror, the support structure including cutaway portions forming a pattern such that at least 50% of support structure material forming the support structure is removed. The micro-mirror assembly can include at least two torsion springs coupled to diametrically opposed ends of the mirror, wherein the torsion springs are configured to apply a rotational force that causes the mirror to rotate at approximately a resonant frequency. In some embodiments, the pattern of the support structure can include a plurality of cells each having a pitch between 100 µm-800 µm. The support structure can be cutaway such that between 50%-90% of the support structure material is removed. In some cases, the mirror is formed as an elliptical, rectangular, round, square, or other polygonal-shaped structure. In some embodiments, the pattern on the support structure includes a plurality of circumferential and radial ridges that form an array of cells.

In further embodiments, a method for forming a semiconductor integrated circuit including a microelectromechanical system (MEMS) and a substrate may include: forming a rotatable mirror structure; forming a rotatable gimbal structure coupled to the mirror structure, wherein the gimbal structure, when rotated, causes the mirror to rotate, and where the gimbal structure is configured concentrically around and coplanar with the mirror; forming a support structure coupled to a backside of the mirror, the support structure configured to increase a stiffness of the mirror; and etching a matrix of cells in the support structure such that at least 50% of support structure material forming the support structure is removed. The method can include forming two torsion springs coupled to diametrically opposed ends of the mirror structure, where the torsion springs are configured to apply a rotational force that causes the mirror to rotate at approximately a resonant frequency. In some embodiments, each cell in the matrix of cells can have a pitch between 100

μm-800 μm. The support structure may be etched such that between 50%-90% of the support structure material is removed. In some embodiments, the mirror and gimbal form an elliptical structure. The method can further include forming a second support structure coupled to a backside of the gimbal structure, the second support structure configured to increase a stiffness of the gimbal structure, and etching a matrix of cells in the second support structure such that at least 50% of second support structure material forming the second support structure is removed.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which.

Throughout the drawings, it should be noted that like reference numbers are typically used to depict the same or similar elements, features, and structures.

DETAILED DESCRIPTION

Figure 1:
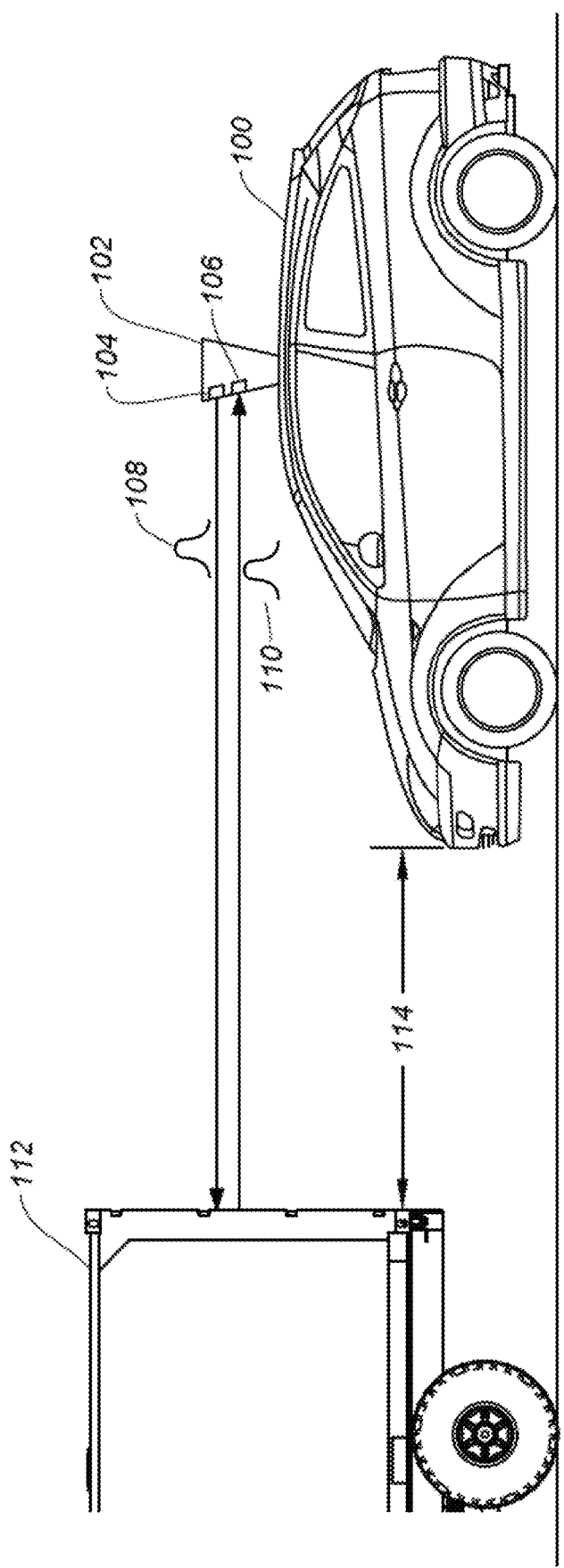
FIG. 1 shows an autonomous vehicle with a LiDAR system, according to certain embodiments.

Aspects of the present disclosure relate generally to LiDAR system, and more particularly to MEMS micro-mirror devices, according to certain embodiments.

In the following description, various examples of MEMS-based micro mirror structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Generally, aspects of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle, and to receive reflected light off of objects around the vehicle using a sequential scanning process, which can be used to determine distances between the objects and the vehicle to facilitate autonomous navigation.

Light steering can be implemented by way of one or more micro-mirror assemblies (e.g., often part of an array), with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate, which can allow for simpler, easier, more robust, and cost-effective manufacturing processes.

In a micro-mirror assembly, a micro-mirror can be mechanically connected (e.g., "anchored") to the semiconductor substrate via a connection structure (e.g., torsion bar, torsion spring, torsion beam, etc.) to form a pivot point and an axis of rotation. As described herein, "mechanically connected," or "connected," can include a direct connection or an indirect connection. For example, the micro-mirror can be indirectly connected to the substrate via a connection structure (e.g., torsion bar or torsion spring) to form a pivot/connection point. The micro-mirror can be rotated around the pivot/connection point ("referred to herein as a pivot point") on the axis of rotation by an actuator. In the embodiments presented herein an electrostatic actuator is typically used, however any suitable type of actuator may be implemented (e.g., piezoelectric, thermal mechanical, etc.), and one of ordinary skill in the art with the benefit of this disclosure would appreciate the many modifications, combinations, variations, and alternative embodiments thereof.

In some embodiments, each micro-mirror can be configured to be rotated by a rotation angle to reflect (and steer) light towards a target direction. The connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply a torque to the micro-mirror based on the rotational moment of inertia of the mirror, as well as the degree of spring stiffness for a given target rotation angle. Different torques can be applied to rotate (e.g., oscillate) the micro-mirror at or near a resonant frequency to achieve different target rotation angles. The actuator can then remove the torque, and the connection structure can return the micro-mirror back to its default orientation for the next rotation. The rotation of the micro-mirror can be repeated in the form of an oscillation, typically at or near a resonant frequency of the micro-mirror based on the mass of the micro-mirror and the spring constant of the connection structure (e.g., shown as a torsion bar throughout the figures of this disclosure). In the various embodiments described throughout this disclosure, references to rotating a micro-mirror "at or near" a resonant frequency can mean within a particular range of the resonant frequency. For instance, "at or near" a resonant frequency may mean within +/−5% of the resonant frequency, although other tolerances are possible (e.g., +/−1%, +/−2%, +/−3%, +/−10%, etc.), as would be appreciated by one of ordinary skill in the art with the benefit of this disclosure. Other terms that can mean "at or near" in the manner described above include "approximately," "substantially," or the like. In some embodiments, connection structures may be configured on opposite and diametrically opposed sides of a mirror or gimbal.

In certain embodiments, each micro-mirror can be configured to receive an incident light beam at a common rotation angle with the other micro-mirrors in the array to collectively steer the incident light beam at a target direction (e.g., in front of the vehicle). In some embodiments, each micro-mirror can be rotated around two orthogonal axes to provide a first range of angles of projection along a vertical dimension and to provide a second range of angles of projection along a horizontal dimension. The first range and the second range of angles of projection can define a two-dimensional field of view (FOV) in which light is projected to detect/scan an object. The FOV can also define a two-dimensional range of directions of incident lights that can be reflected by the object and detected by the receiver. Less commonly, LiDAR systems may also operate over a single axis (e.g., along a horizontal direction). One of ordinary skill in the art with the benefit of this disclosure would appreciate the many implementations and alternative embodiments thereof.

The frequency that a micro-mirror rotates can define the time it takes for each micro-mirror to progressively sweep through a range of projection angles, which can have a direct effect on the image resolution of the scanning operation. A higher resolution of the scanning operation can be achieved by increasing the rotation frequency of the micro-mirrors. The frequency of rotation can be affected by the degree of stiffness (e.g., spring constant) of the connection structure that couples the micro-mirror and the substrate (e.g., at an anchor structure). A connection structure with a high spring stiffness can return the micro-mirror back to its neutral orientation faster, which can allow a faster frequency of rotation of the micro-mirror and the scanning resolution. The resonant frequency can be expressed as $\omega=\sqrt{k/J}$ where k is the spring constant of the connection structure (e.g., a torsional beam), and J is the moment of inertia for the mirror structure.

In some embodiments, improving the FOV, detection range, and/or the resolution of the scanning operation can lead to an increase in the overall spring stiffness of the connection structure between the micro-mirror and the substrate. Specifically, to increase the FOV and/or the detection range, the size of a micro-mirror can be increased to provide a larger aperture. The increase in the size of the micro-mirror can lead to increase in the rotational moment of inertia of the micro-mirror. This may require the connection structure to have a higher spring stiffness to improve the structural integrity of the pivot point, otherwise the connection structure may break due to the repeated rotation of the micro-mirror. Moreover, to increase the resolution of the scanning operation, the rotation frequency of the micro-mirror can be increased, which can be achieved by increasing the spring stiffness of the connection structures to bring the micro-mirror back to its default position at a higher rate or decrease the moment of inertia.

Increasing the overall spring stiffness of the connection structures, however, can increase a non-linearity of a required torque with respect to a rotation angle. For example, the degree of spring stiffness can increase at a much higher rate at a relatively large angle of rotation than for a relatively small angle of rotation, which means a disproportionately large torque may be needed to achieve a large target rotation angle. This can make the micro-mirror more difficult to control and may increase the complexity of the control algorithm. Furthermore, the large moment of inertia and high spring stiffness may require a relatively high actuator force, which may not be achievable in some large-aperture micro-mirror implementations. Therefore, it is desirable to reduce the moment of inertia of a large aperture micro-mirror to reduce the overall degree of spring stiffness of the connection structures, thereby reducing the non-linearity of the scanning operation and improving the overall control of the micro-mirror assembly.

Conceptual Overview of Certain Embodiments

Embodiments described in the present disclosure relate to a LiDAR system that can address the problems described above. Various examples of light steering can include a plurality of MEMS-based micro-mirrors configured to perform light steering, such as those shown and described below with respect to FIGS. 2A-2D. For instance, the MEMS-based systems described herein can be a part of a transmitter configured to control an incident angle of a projection of output light or part of a receiver configured to select an angle of reflected input light for object detection. Some embodiments may employ a coaxial configuration such that the light steering system can project output light to a location and detect light reflected from the same location, as would be appreciated by one of ordinary skill in the art with the benefit of this disclosure.

Figure 3A:
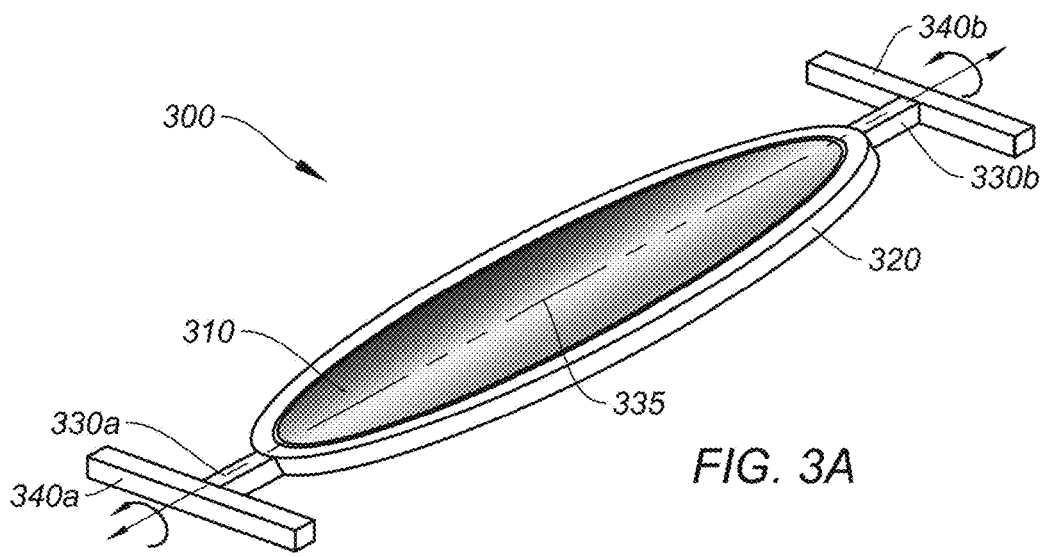
FIGS. 3A-3C show a MEMS-based mirror structure oriented in various stages of oscillation, according to certain embodiments.
Figure 3B:
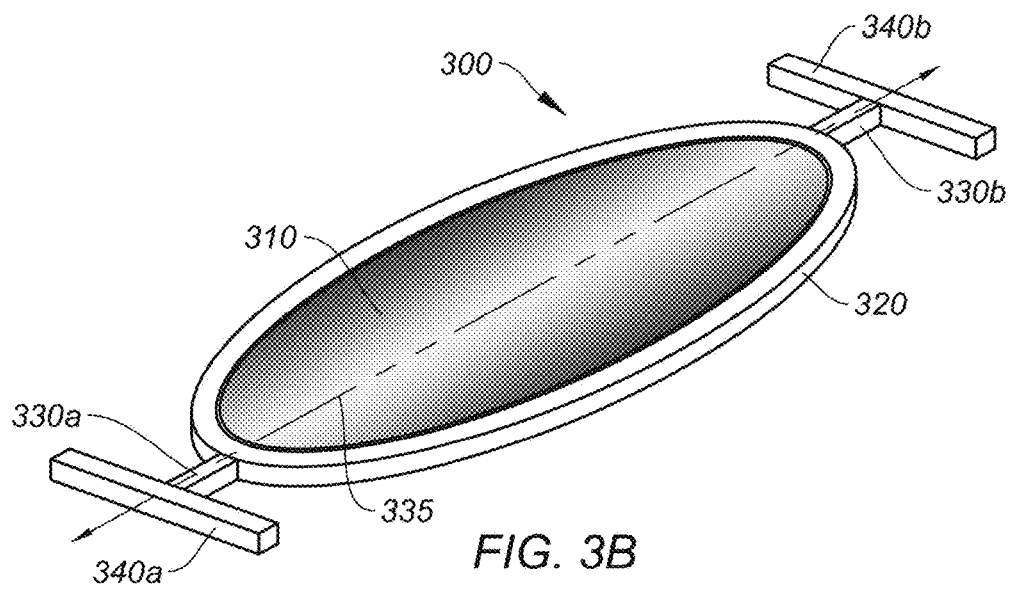
Figure 3C:
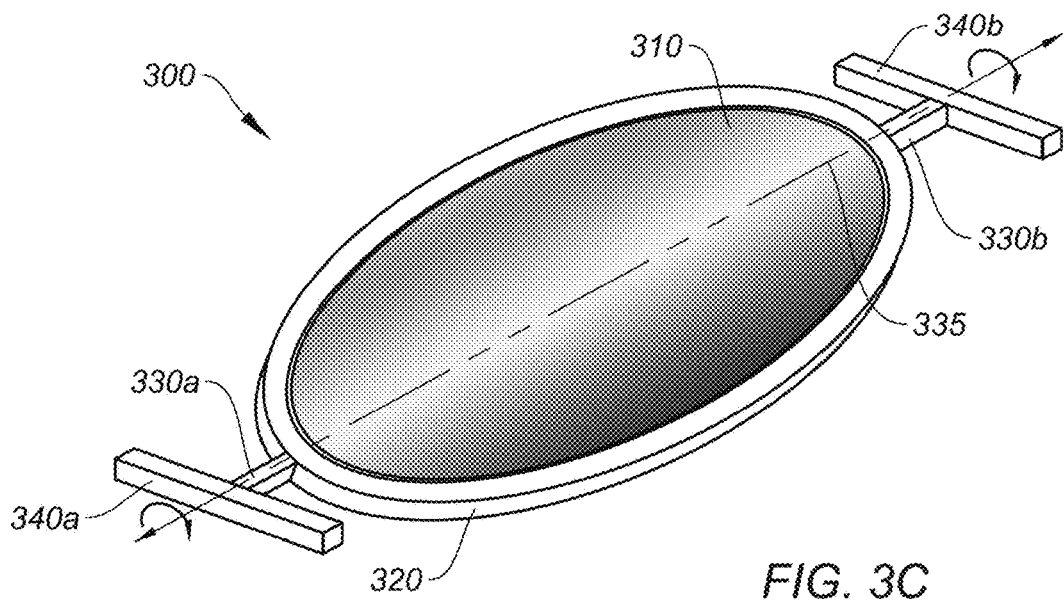

Typically, a uniformly flat mirror is considered ideal, however dynamic deformation (mirror curvature changing with time) can be introduced in real-world applications as the mirror oscillates at or near a resonant frequency. FIGS. 3A-3C show examples of how dynamic deformation can affect a MEMS-based micro-mirror structure, according to certain embodiments. In some embodiments, a gimbal structure can be configured between the micro-mirror and torsion bar to help keep the mirror flat during oscillation, however large aperture micro-mirror assemblies can still be susceptible to dynamic deformation. In some embodiments of single mirror designs presented herein, a 6×15 mm$^2$ and a 10×18 mm$^2$ is shown or described, however other dimensions and polygonal shapes are possible. The operational frequency of some micro-mirror assemblies may range from 1 kHz-5 kHz in LiDAR applications, although other ranges are possible, as would be appreciated by one of ordinary skill in the art with the benefit of this disclosure. To help mitigate dynamic deformation, a thicker mirror can be implemented to increase its stiffness, but will result in an increased mass and corresponding increase in the rotational moment of inertia (due to the larger rotational spring constant to keep its natural frequency at a constant level), which can exacerbate the problems described above. To address this problem and take advantage of the stiffness of a thicker mirror, certain of the invention include a dual layered structure including a MEMS-based mirror structure with a hollowed skeleton structure configured on the back to provide improved mechanical support. The novel skeleton structure (also referred to as a "support structure," "skeleton support structure," "back support" structure, "backside skeleton," or "backside structure") can operate to increase the stiffness of the mirror with a relatively small increase in mass, which can both reduce the moment of inertia of the rotating mirror and reduce dynamic deformation. Some examples of MEMS-based mirror structures that utilize a support structure are shown, for example in FIGS. 4-6. The examples shown are elliptical and incorporate a support structures with both radial and circumferential structural beams that form a matrix of cells. Put in simplified terms, the structural beams provide greater stiffness, and the voids in between (e.g., the cells) provide a reduced the overall mass and moment of inertia of the support structure. There are myriad ways of implementing the skeleton support structure, as provided in the description below, and as would be appreciated by one of ordinary skill in the art with the benefit of this disclosure.

As described above, to help minimize dynamic deformation in MEMS-based micro-mirror arrays, a thicker mirror can be used to increase the stiffness of the mirror structure. A thicker mirror will have a larger rotational moment of inertia and a larger rotational spring constant. Thus, the heavier, larger mirror will require a wider or shorter torsion bar, which can increase its non-linearity, and further require a larger driving force to maintain a constant oscillation angle of the mirror.

To achieve a larger driving force, certain embodiments of the invention are directed to a gimbaled MEMS-based micro-mirror structure that contains multiple comb spines with comb electrodes that operate as additional electrostatic comb drives that are configured to generate a larger electrostatic force that is well-suited for larger mirrors. Some examples of micro-mirror structures with multiple comb spines (also referred to as "spines") are shown and described below with respect to FIGS. 10 and 12. The multiple comb spines can be implemented in a variety of ways, with each comb spine typically including one or two rows of comb electrodes (e.g., extending normal to the comb spine). Typically, comb spines are designed to be sufficiently mechanically strong to support their comb electrodes, yet not too heavy to keep the increase to the moment of inertia relatively low. Any number of comb spines and comb electrodes can be used, which may depend on the amount of drive force that is needed to excite the micro-mirror to oscillate at or near a resonant frequency at a given magnitude of angle. Comb spines can be solid or hollow (e.g., to further reduce their weight). Typically, each comb spine is parallel to the rotational axis of the corresponding micro mirror and the comb electrodes are perpendicular to the rotational axis. In some implementations, the array of micro-mirror assemblies described herein can be implemented in a silicon-on-insulator (SOI) wafer as further described below.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light pulse 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

FIG. 2A-FIG. 2D illustrate examples of internal components of a LiDAR module 102. LiDAR module 102 can include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214 and a photodetector 216. LiDAR module 102 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

Figure 2A:
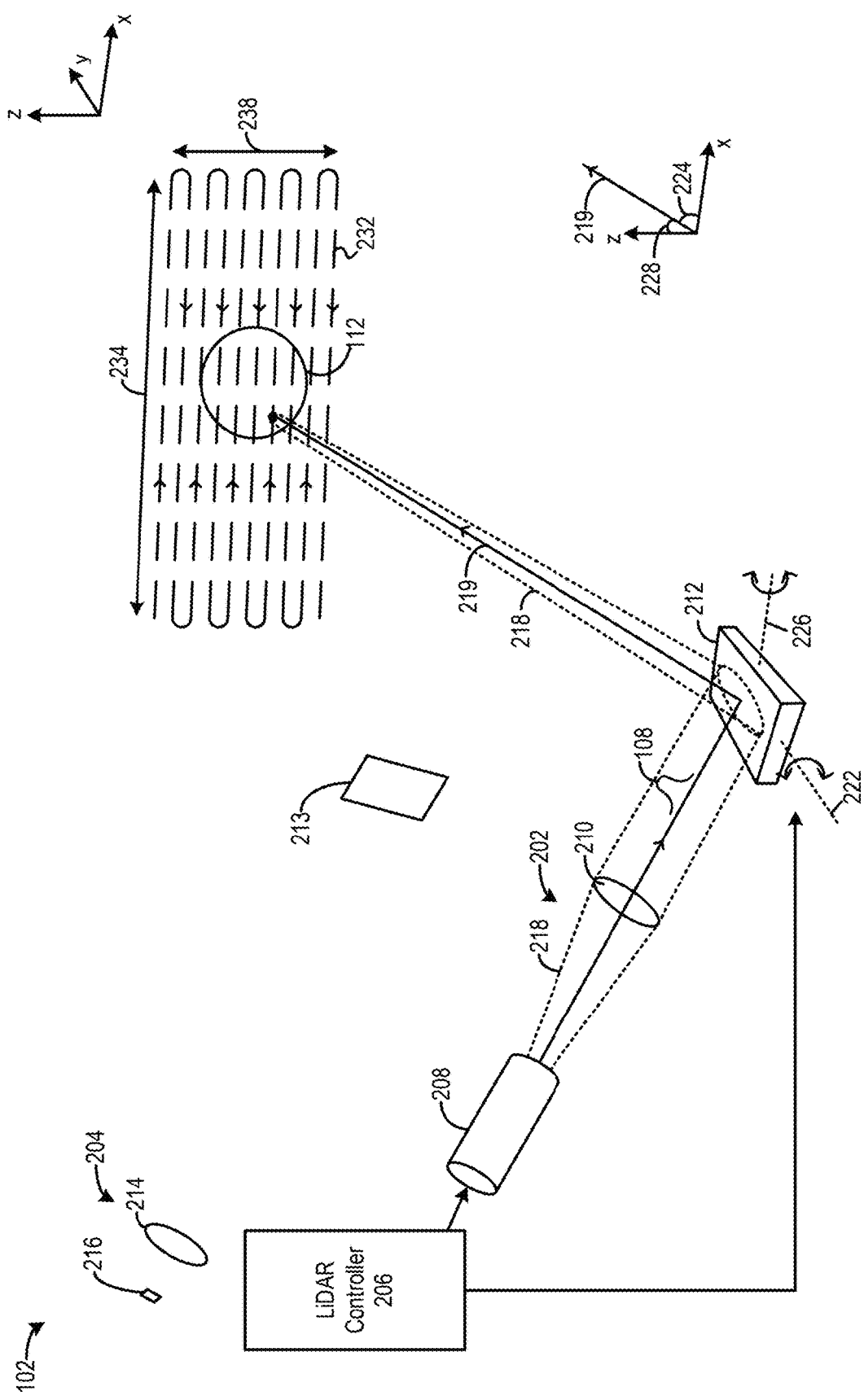
FIG. 2A shows an example of a light projection operation, according to certain embodiments.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light 218 to steer it along an output projection path 219 towards object 112. Mirror assembly 212 can include one or more rotatable mirrors. FIG. 2A illustrates mirror assembly 212 as having one mirror, however a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form reflected light signal, which can be received by receiver 204 and detected by the LiDAR module, as further described below with respect to FIG. 2B. In certain embodiments, mirror assembly 212 can include a back skeleton (see, e.g., FIG. 4) and/or one or more comb spines with comb electrodes (see, e.g., FIG. 10), as will be described in further detail below.

Figure 2B:
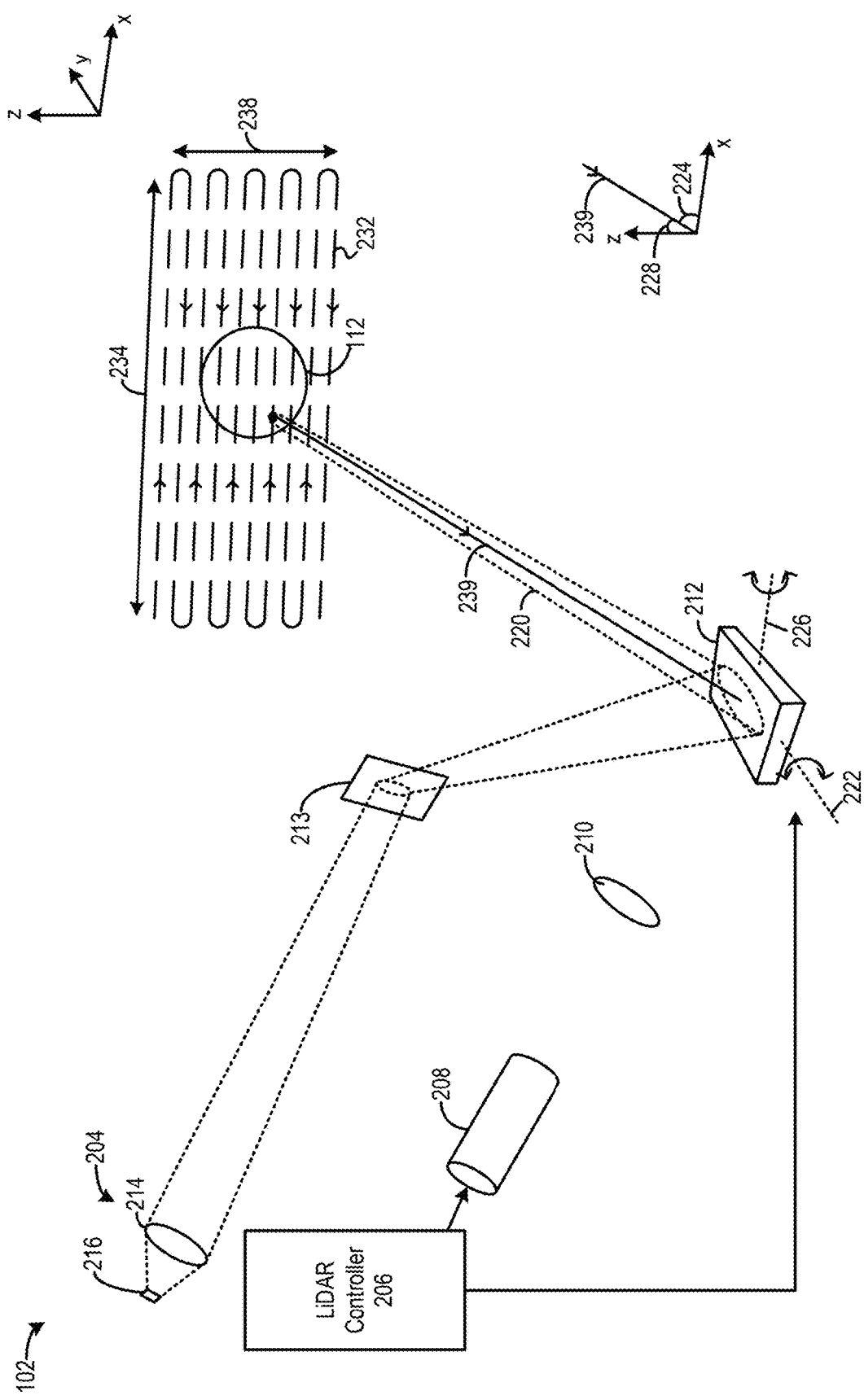
FIG. 2B shows an example of a light detection operation, according to certain embodiments.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Figure 2C:
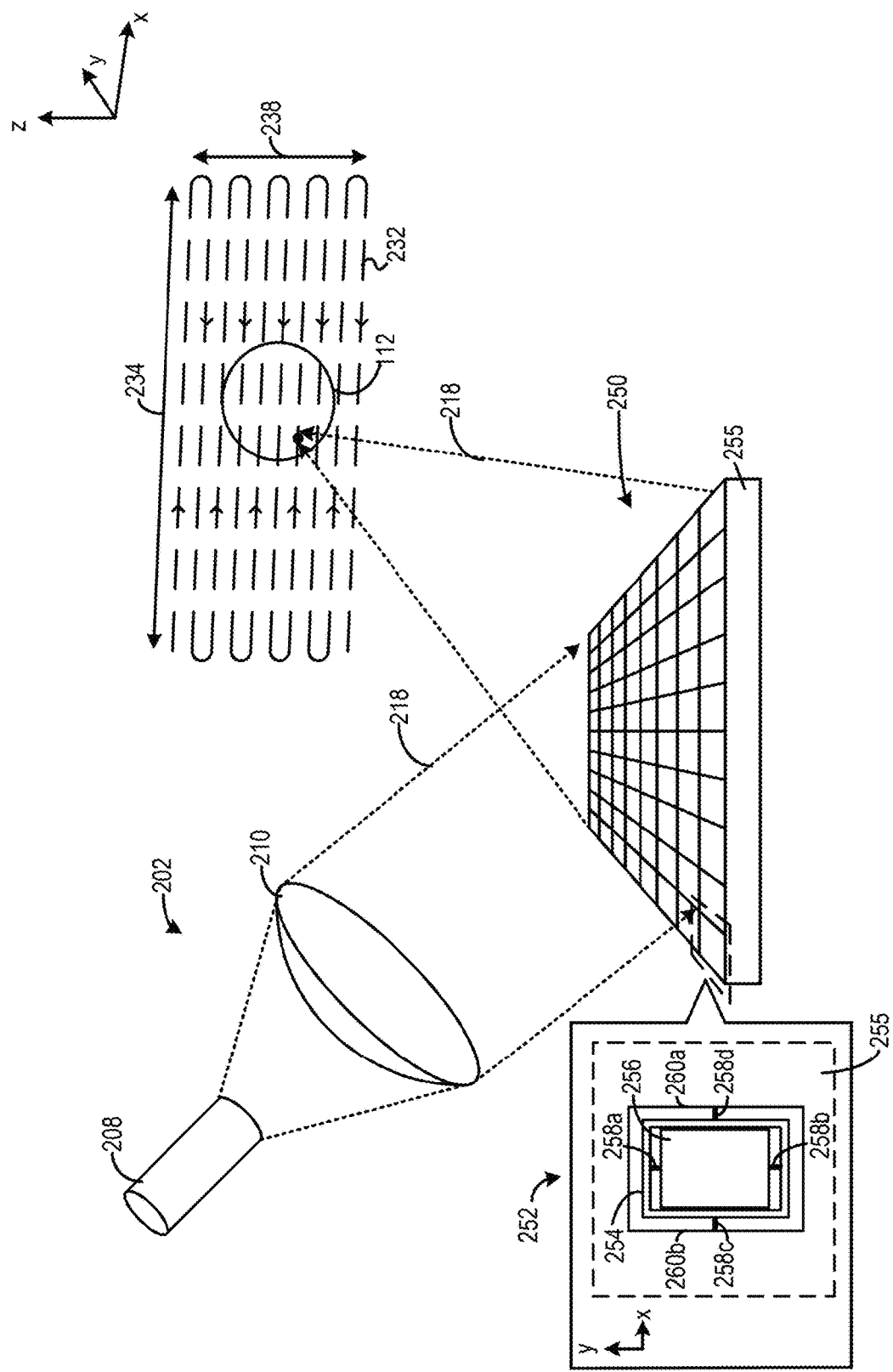
FIG. 2C shows an example of a micro-mirror array that can be part of light steering transmitter and can provide the steering capability of mirror assembly, according to certain embodiments.

FIG. 2C shows an example of a micro-mirror array 250 that can be part of light steering transmitter 202 and can provide the steering capability of mirror assembly 212, according to certain embodiments. Micro-mirror array 250 can include an array of micro-mirror assemblies (also referred to as micro-mirror structures), including micro-mirror assembly 252. Micro-mirror assembly 252 can include a microelectromechanical system (MEMS) implemented on a semiconductor substrate 255. Micro-mirror assembly 252 may include a frame 254 that forms a gimbal structure. Specifically, connection structures 258a and 258b connect micro-mirror 256 to frame 254 (referred to as the "gimbal" herein), whereas connection structures 258c and 258d connect frame 254 (and micro-mirror 256) to side walls 260a and 260b semiconductor substrate 255 at a pair of pivot points. A pair of connection structures can define a pivot/axis of rotation for micro-mirror 256. For example, connection structures 258a and 258b can define a pivot/axis of rotation of micro-mirror 256 about the y-axis within frame 254, whereas connection structures 258c and 258d can define a pivot/axis of rotation of frame 254 and micro-mirror 256 about the x-axis with respect to semiconductor substrate 255.

Figure 2D:
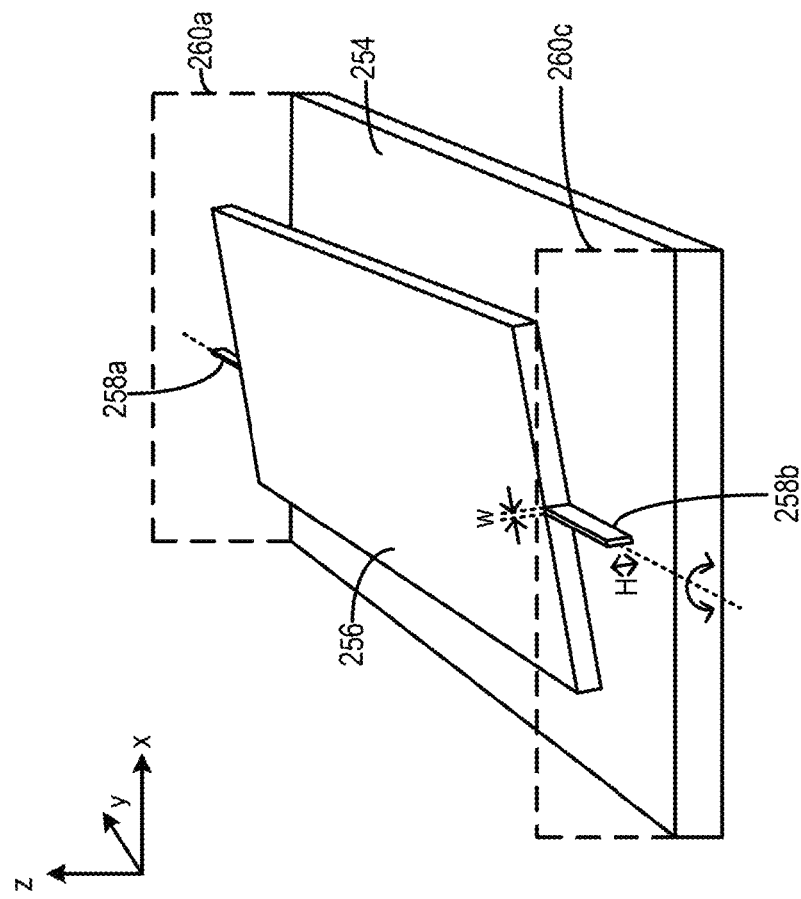
FIG. 2D shows another view of a micro-mirror assembly including corresponding connection structures, according to certain embodiments.
Figure 2D:
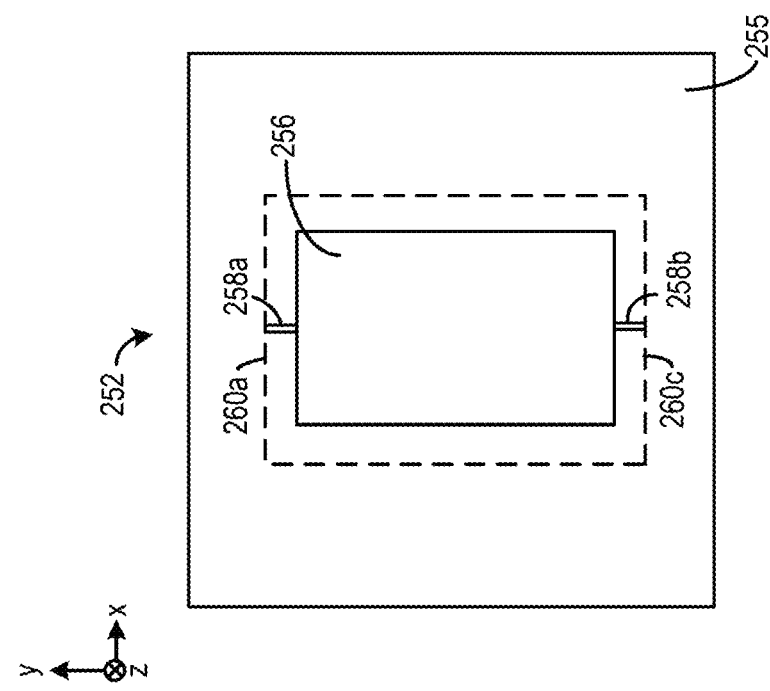

A micro-mirror assembly 252 can receive and reflect part of light beam 218. Micro-mirror 256 of micro-mirror assembly 252 can be rotated by an actuator of the micro-mirror assembly (not shown) at a first angle about the y-axis (around connection structures 258a and 258b) and at a second angle about the x-axis (around connection structures 258c and 258d) to set the direction of the output projection path for light beam 218 and to define the FOV, as shown in FIG. 2A, or to select the direction of input light to be detected by receiver 204, as shown in FIG. 2B. FIG. 2D shows another view of micro-mirror assembly 252 including connection structures 258a and 258b having a width w and a thickness H, according to certain embodiments.

To accommodate the rotation motion of mirror 256, connection structures 258a, 258b, 258c, and 258d are configured to be elastic and deformable. The connection structure can be in the form of, for example, a torsion bar, a spring, etc., and can have a certain spring stiffness. The spring stiffness of the connection structure can define a torque required to rotate mirror 256 by a certain rotation angle, as follows:

$$\tau = -K\theta \quad \text{(Equation 1)}$$

In Equation 1, τ represents torque, K represents a spring constant that measures the spring stiffness of the connection structure, whereas θ represents a target angle of rotation. The spring constant can depend on various factors, such as the material of the connection structure, the cross-sectional area of the connection structure, etc. For example, the spring constant can be defined according to the following equation:

$$K = \frac{k_2 \times G \times w^3 \times H}{L} \quad \text{(Equation 2)}$$

In Equation 2, L is the length of the connection structure, G is the shear modulus of material that forms the connection structure, $k_2$ is a factor that depends on the ratio between thickness (H) and width (w) given as H/w.

Based on Equations 1 and 2, different torques can be applied to the micro-mirror to achieve different target rotation angles to start the rotation. The actuator can then remove the torque, and the elasticity of the connection structure, defined by the spring constant, can return micro-mirror 256 back to its default orientation to begin the next rotation. The rotation of micro-mirror 256 can be repeated in the form of oscillation. When in a steady state, micro-mirror 256 can rotate at or near a resonant frequency ω based on the spring constant of connection structures 258a-d as well as the mass of micro-mirror 256, as follows:

$$\omega = \sqrt{\frac{K}{J}} \quad \text{(Equation 3)}$$

In Equation 3, K is the spring constant of connection structures 258a-d, whereas J is the moment of inertia of micro-mirror 256. The actuator can apply and then remove a torque at the natural frequency of the micro-mirror to maintain the oscillation. During steady state, a torque can be applied at the resonant frequency to overcome the damping to the oscillation. The damping can be caused by various sources, such as air friction encountered by the micro-mirror as the micro-mirror rotates, which introduces air damping.

Figure 2E:
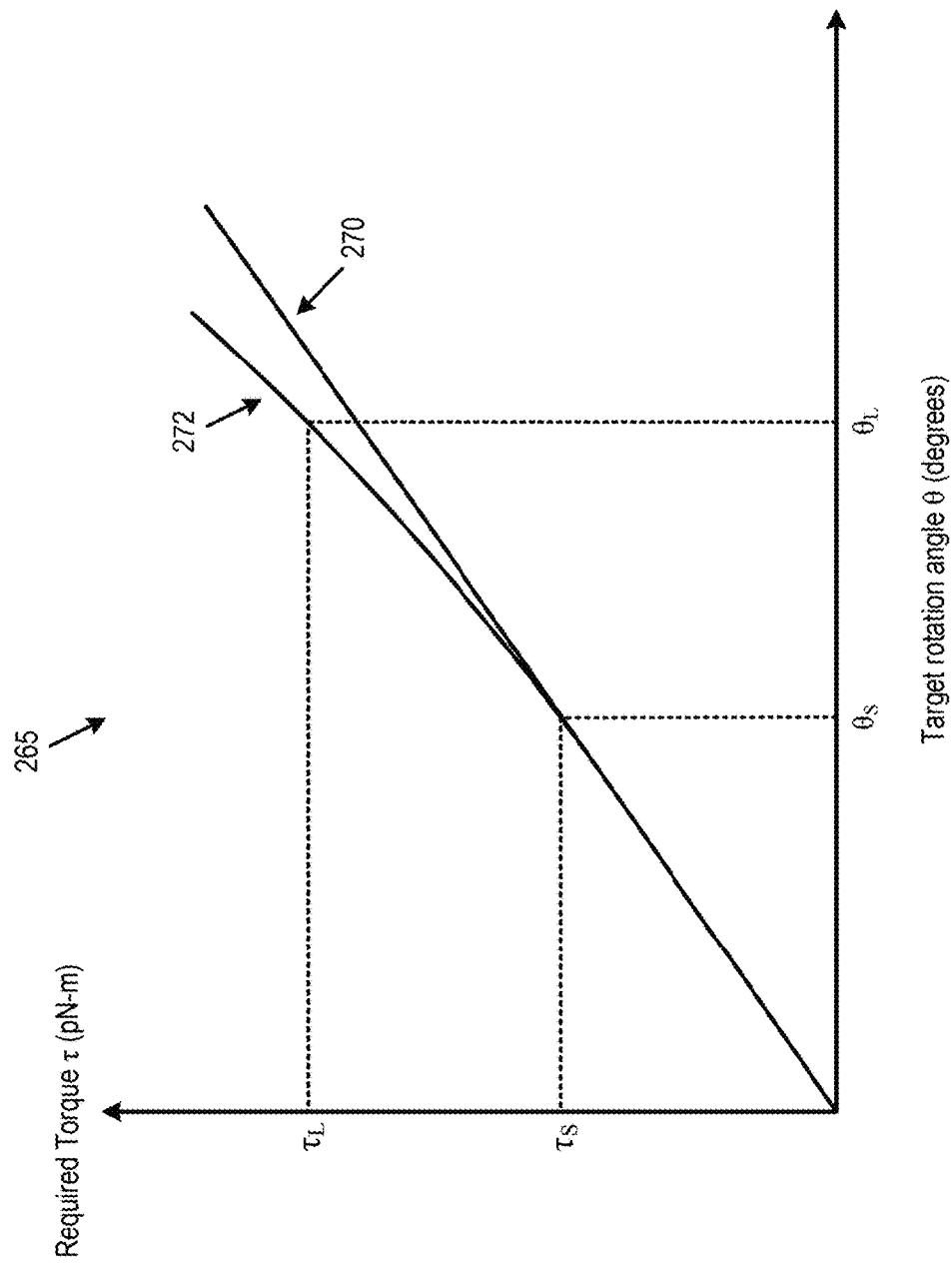
FIG. 2E depicts a graph showing examples of relationships between a target rotation angle θ and a required torque τ to achieve the target rotation angle for connection structures, according to certain embodiments.

FIG. 2E depicts a graph 265 showing examples of relationships between a target rotation angle θ and the required torque τ to achieve the target rotation angle for connection structures 258a-d, according to certain embodiments. As shown in FIG. 2E, plot 270 shows a linear relationship between the required torque and the target rotation angle, where the spring constant K remains constant within a range of target rotation angles. In contrast, plot 272 shows a non-linear relationship between the required torque and the target rotation angle, where the spring constant K increases as the target rotation angle increases. As a result, the torque $\tau_L$ required to rotate the micro-mirror by a large target rotation angle $\theta_L$ can become disproportionately large compared with the torque is required to rotate the micro-mirror by a small target rotation angle θs.

The spring constant K can become constant across a range of target rotation angles when the ratio between thickness (H) and width (w) of the connection structure is large. The larger the ratio H/w, the more the factor $k_2$ of Equation 2 is like a constant. On the other hand, when the ratio H/w is reduced due to, for example, an increased width, the factor $k_2$ and the spring constant K may increase with the target rotation angle.

There can be various reasons for increasing the width of connection structures 258a-d and the degree of stiffness of connections structures 258a-d. One reason can be due to a large moment of inertia of micro-mirror 256. The moment of inertia of micro-mirror 256 may increase due to an increase in the size (and mass) of micro-mirror 256. The size of micro-mirror 256 can be increased to increase the reflective surface area, which can increase the aperture size and improve the FOV and detection range of LiDAR module 102. With the micro-mirror having a larger moment of inertia, the connection structures typically should have a higher spring stiffness to improve the structural integrity of the pivot points, otherwise the connection structure may break due to the repeated rotation of the micro-mirror. In addition, the width of connection structures 258a-d and the degree of stiffness (spring constant K) of connections structures 258a-d can be increased, to increase the resonant frequency ω of rotation of micro-mirror 256. The resonant frequency can be increased to improve the resolution (in time) of the scanning operation. With a higher resonant frequency, the micro-mirrors can repeat the scanning operation at a higher rate, which allows the detection/measurement operation of objects to be performed at a higher rate, which can improve the resolution of the detection/measurement operation.

Increasing the overall spring stiffness of the connection structures, however, can increase the non-linearity of required torque with respect to rotation angle. For example, as shown in graph 272 of FIG. 2E, the degree of spring stiffness can increase at a much higher rate at a relatively large rotation angle rather than at a relatively small rotation angle, thus a disproportionately large torque may be needed to achieve a large target rotation angle. This makes the micro-mirror more difficult to control and may increase the complexity of the control algorithm. As described above, the various embodiments described below at least with respect to FIGS. 4-12 present solutions to address these issues.

FIGS. 3A-3C show a scanning MEMS-based mirror assembly 300 oriented in various stages of oscillation, according to certain embodiments. Mirror assembly 300 may be a part of an array of mirror assemblies, as described above. Mirror assembly 300 can include a mirror 310, a gimbal 320, connection structures (e.g., torsion springs) 330a and 330b, and anchors 340a and 340b that anchor (e.g., secure) the mirror assembly to the substrate (not shown). Mirror 310 may be coupled to gimbal 320 by one or more mirror connectors (see, e.g., FIG. 6). The term "mirror structure" may be used to reference a combination of the gimbal 320 and mirror 310 in embodiments that incorporate a gimbal, or to reference just mirror 310 in embodiments that do not incorporate a gimbal. As described above, the mirror structure rotates (oscillates) between deflection angles (e.g., the FOV) at or near a resonant frequency. A typical micro-mirror mechanical angle of deflection can range at about +/−10° for LiDAR applications, although other ranges are possible as would be appreciated by one of ordinary skill in the art with the benefit of this disclosure. Although many of the embodiments as shown in the figures include gimballed structures, one of ordinary skill in the art with the benefit of this disclosure would appreciate that non-gimballed (e.g., mirror-only) embodiments may implement the novel ideas presented herein (e.g., the backside skeleton and comb spine structures).

As indicated above, a completely flat mirror is ideal, but in practice the oscillation of the mirror structure may cause dynamic deformation, or a mirror curvature changing with time. The inclusion of a gimbal structure configured between the mirror and torsion spring, as described above, may operate to help keep the mirror flat during oscillation. Instead of the connection structures 330a, 330b (e.g., torsion bar) directly torqueing the mirror and potentially causing dynamic deformation during oscillation, gimbal 320 is subjected to the direct torqueing by the connection structures, which in turn "pulls" the mirror along with it via a plurality of gimbal mirror connectors that couple the mirror to the gimbal, as shown in more detail in FIG. 6. Despite the potential reduction in dynamic deformation due to the use of a gimbal structure, gimballed mirror structures are still subject to dynamic deformation. FIGS. 3A-3C show mirror assembly 300 being deflected by connection structures 330a, 330b at a first, second, and third deflection angle, respectively, about axis of rotation 335 and subject to different amounts of dynamic deformation. The dynamic deformation is shown as a grayscale gradient representation with areas on the mirror structure that are subject to little deformation (e.g., typically areas around the axis of rotation) are shown to trend towards a white color, and areas subject to the most dynamic deformation (e.g., typically areas farthest from the axis of rotation; areas with relatively larger moment arms) are shown to trend towards a black color. Although not shown for the sake of simplicity of the concepts of dynamic deformation, the gimbal is typically subject to dynamic deformation as well. Furthermore, the embodiments described herein that incorporate the various novel concepts presented herein (e.g., a backside skeleton structure and/or comb spines and electrodes) are shown as single-rotational axis mirror structures (see, e.g., FIG. 4 and FIG. 10), however these novel concepts may be applied to dual-rotational axis mirror structures (see, e.g., FIG. 2C) as well, as would be understood by one of ordinary skill in the art with the benefit of this disclosure.

As also indicated above, another solution to help minimize dynamic deformation in the mirror structure is to use a thicker mirror. A thicker mirror may be stiffer and less susceptible to dynamic deformation, but may include a larger rotational moment of inertia and correspondingly stiffer rotation spring constant (e.g., to keep the mirror's natural resonant frequency at a constant level). A larger spring constant may require a fatter or shorter torsion bar, which can increase non-linearity of operation and also require a larger driving force to maintain a constant oscillation and corresponding deflection angle (e.g., the FOV) for the mirror. To gain the advantage of the stiffness of a thicker mirror without the proportional increase in the rotational moment of inertia, a backside skeleton may be used, as shown and described below at least with respect to FIGS. 4-7.

Figure 4:
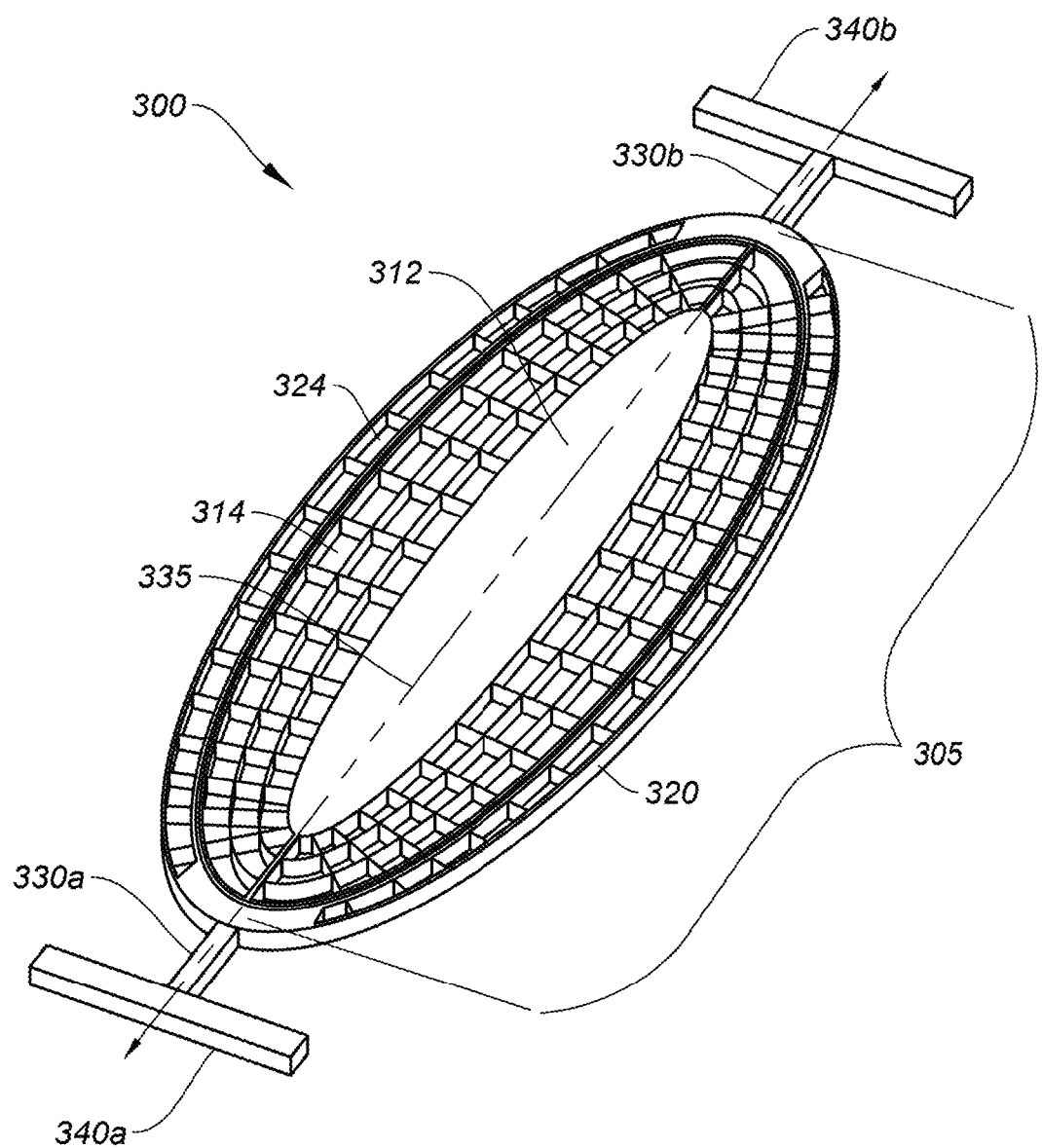
FIG. 4 shows a support structure coupled to a backside of a MEMS-based mirror structure, according to certain embodiments.

The various mirror structures presented herein are shown with an elliptical configuration, according to certain embodiments. Other mirror structures (e.g., mirror or mirror plus gimbal configurations) are possible including mirror structures with square shapes, rectangular shapes (e.g., as shown in FIGS. 2C and 2D), round shapes, triangular shapes, trapezoidal shapes, or any suitable polygon structure configured to reflect light as described herein. One of ordinary skill in the art with the benefit of this disclosure would appreciate the many modifications, variations, and alternative embodiments thereof Backside Skeletal Support for Gimbal-Mirror Structure FIG. 4 shows a backside skeleton structure 305 (referred to as a "support structure") coupled to a backside of a mirror 310 and gimbal 320 that forms a dual-layered overall mirror structure, according to certain embodiments. Support structure 305 is shown as a mostly hollow backside skeleton that provides mechanical support and is configured to both reduce the moment of inertia of the rotating mirror and help keep the mirror flat. Support structure 305 adds thickness to mirror 310 and gimbal 320, thereby increasing the stiffness and resistance to dynamic deformation. The moment of inertia is reduced by etching out portions of support structure 305 to reduce its mass. In some embodiments, as much as 90% or more of the material comprising support structure 305 can be removed. Referring back to FIG. 4, support structure 305 includes a plurality of cells 314 etched behind mirror 310 and cells 324 etched behind the gimbal 320. A central portion 312 of support structure 305 is solid and is typically not etched as it contributes a relatively small amount of moment of inertia but can provide sufficient structural stiffness to resist dynamic deformation as well as resist up-down piston motion. However, certain embodiments may also include etched material on central portion 312, such as etched cells, as shown for example in FIG. 5C. Support structure is typically comprised of the same material as mirror structure 300 (e.g., silicon) and can be manufactured with the mirror structure as a single monolithic MEMS device. There are myriad processing flows for creating a backside skeleton structure on a micro-mirror. In some embodiments, a silicon on insulator (SOI) can be used as a starting material, which is a "sandwiched" structure comprised of two silicon layers bonded and separated by a thin layer of oxide. One side of the SOI structure (e.g., typically the device layer) typically includes a mirror surface, and the opposite side (e.g., typically a handle layer) is etched to form cell structures forming the backside skeleton, as further described below.

In some embodiments, the cells may be formed by arrays of both radial and circumferential structural beams (also referred to as bracing or transverse stiffeners, and circumferential/radial ridges or beams, as depicted in FIG. 4), which provide a structural stiffness on one hand, and can materially reduce the rotational moment of inertia for the mirror structure on the other. Circumferential ridges (or beams, stiffeners, etc.) refer to the portions of the cell walls that form concentric ellipses relative to central portion 312. Radial ridges (or beams, stiffeners, etc.) refer to the portions of the cell walls that extend radially from central portion 312. The ratio of hollow portions (e.g., cells) over solid portions (e.g., radial and circumferential structural beams) may depend on the natural frequency required and the maximum acceptable dynamic deformation, as would be appreciated by one of ordinary skill in the art with the benefit of this disclosure. In some embodiments, the cells may be formed in a grid pattern that is not based on a concentric ring or oval structure (e.g., see FIG. 5C), however cell orientation is typically related to the shape of the micro-mirror. In some embodiments, a ratio of 0.9 or higher is possible (e.g., 90% of the backside material is removed to form the cells), although other higher or lower ratios are possible. Furthermore, the number of circumferential ridges (and corresponding cells) and/or radial ridges can be adjusted according to a performance requirement. For example, the number of circumferential ridges, radial ridges, and/or cells can be increased or decreased depending on a target resonant frequency and dynamic deformation tolerances. The size of central portion 312 can be modified according to performance requirements or may be eliminated in some cases (e.g., completely hollowed out or filled with cells), according to certain embodiments, as would be appreciated by one of ordinary skill in the art with the benefit of this disclosure. Put simply, support structure 305 is typically etched (e.g., material is removed) as much as possible (e.g., up to 90% or more, with a typical range of 50%-90% to achieve and maintain oscillation at or near a resonant frequency) to keep the overall rotational moment of inertia low, but with enough circumferential and radial stiffeners (e.g., cells) to maintain stiffness and rigidity in mirror 310. That is, the network of ridge structures not only reduces the total mass of the micro-mirror, but also reduces the mass at the furthest from the pivot point of the micro-mirror assembly, hence reducing the overall moment of inertia of the micro-mirror. Moreover, the network of ridge structures can intersect to improve the rigidity of the network as well as the micro-mirror body.

The cells formed by the circumferential and radial stiffeners may have uniform dimensions with respect to each other. In some embodiments, the cells may be different sizes on different locations of the support structure. A typical ridge in a MEMS-based mirror structure may have approximately a 500 μm pitch, however wider or narrower pitches are possible. As used herein, the pitch can refer the distance between two circumferential ridges, but it may also refer to a distance between radial ridges, or a combination thereof. In some embodiments, central portion 312 may typically have little or no etching, as this region may not contribute much to the rotational moment of inertia as compared to locations radially farther away from the rotation axis 335 but may still have a material contribution to the stiffness of the mirror structure as a whole. However, central portion 312 may be as small or large as needed, and may or may not include removed material (e.g., circumferential and/or radial ridging).

Although many of the embodiments shown herein present the support structure as having cells defined by circumferential and radial ridges, any type of etched pattern of any symmetrical or asymmetrical shape and/or depth may be used. Some embodiments may not have a "pattern" or matrix configuration and may include large trenching or other method to remove material from the support structure, but preferably maintain structural integrity and good stiffness and reduced mass.

Figures 5A, 5B:
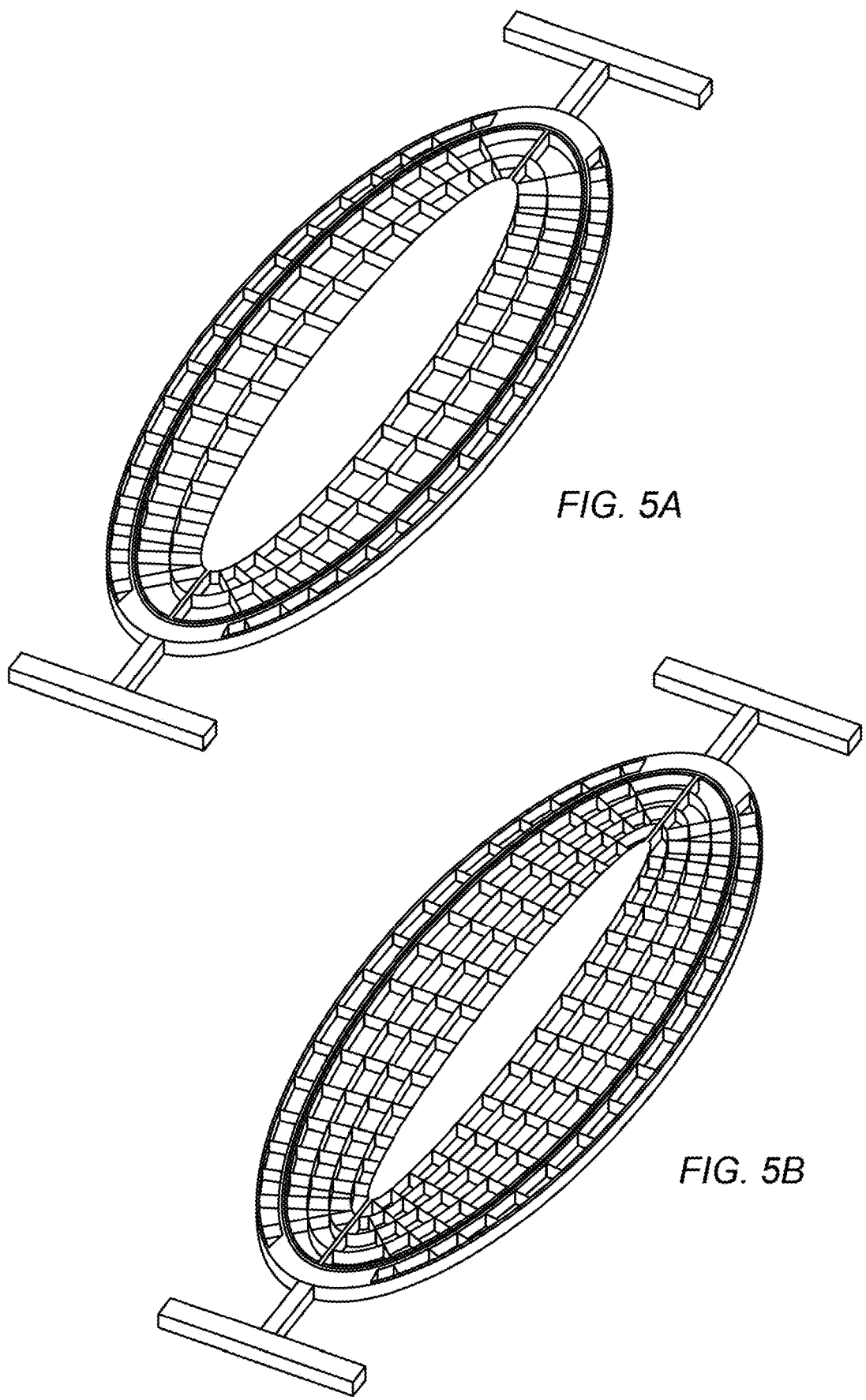
FIG. 5A shows a second embodiment of a support structure coupled to a backside of a MEMS-based mirror structure, according to certain embodiments.
FIG. 5B shows a third embodiment of a support structure coupled to a backside of a MEMS-based mirror structure, according to certain embodiments.

FIGS. 5A-5D present different configurations of support structures, according to certain embodiments. FIG. 5A, for instance, shows a support structure coupled to a backside of a MEMS-based mirror structure, including the mirror and gimbal, with fewer circumferential and radial ridges and larger corresponding cell sizes as compared to the embodiment of FIG. 4. Fewer ridges may correspond to more material (e.g., silicon) etched from the support structure, which may operate to further reduce the rotational moment of inertia of the overall mirror structure, but may reduce its stiffness and susceptibility to dynamic deformation.

FIG. 5B shows a support structure coupled to a backside of a MEMS-based mirror structure, including the mirror and gimbal, with more circumferential and radial ridges and smaller corresponding cell sizes as compared to the embodiment of FIG. 4 that encroach further along the central portion of the support structure, which may operate to increase the rotational moment of inertia of the overall mirror structure, but may also increase stiffness and reduce its susceptibility to dynamic deformation. Heavier structures may require greater force and stronger actuators. In some implementations, one or more comb spines and electrodes can be implemented to achieve greater rotational force, as further described below.

Figure 5C:
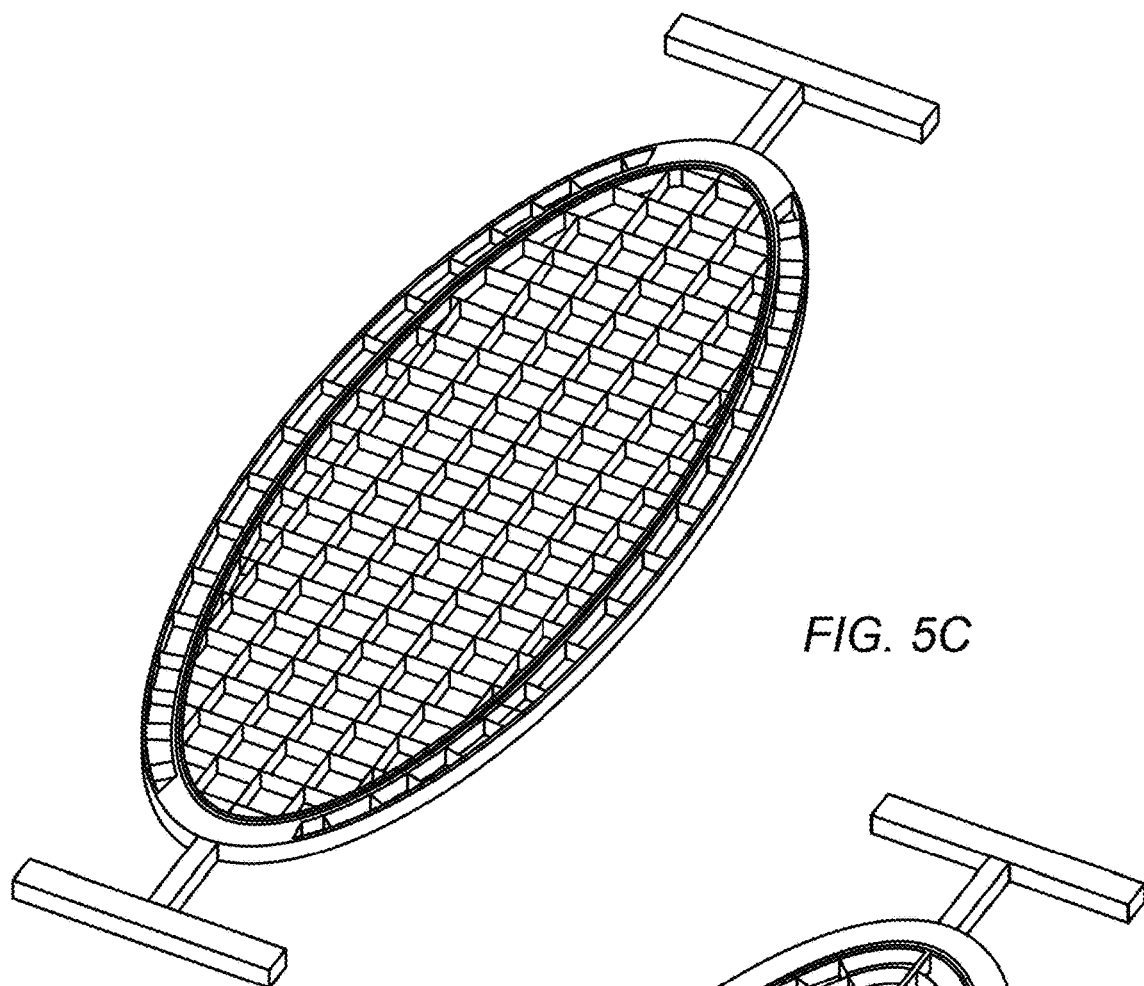
FIG. 5C shows a fourth embodiment of a support structure coupled to a backside of a MEMS-based mirror structure, according to certain embodiments.

FIG. 5C shows a further embodiment of a support structure coupled to a backside of a MEMS-based mirror structure including the mirror and gimbal, according to certain embodiments. The ridges and corresponding cells cover the entire area of the backside of the mirror and gimbal structure, including the central portion of the mirror. However, the ridges are configured in a Euclidian arrangement (e.g., distributed over and x and y axis) and not in a radial and circumferential arrangement, as shown in FIGS. 5A-5B. Fewer ridges may correspond to more material (e.g., silicon) etched from the support structure, which may operate to further reduce the rotational moment of inertia of the overall mirror structure, but may reduce its stiffness and susceptibility to dynamic deformation. Further, the non-radial/circumferential arrangement may affect performance parameters differently, as would be appreciated by one of ordinary skill in the art with the benefit of this disclosure.

Figure 5D:
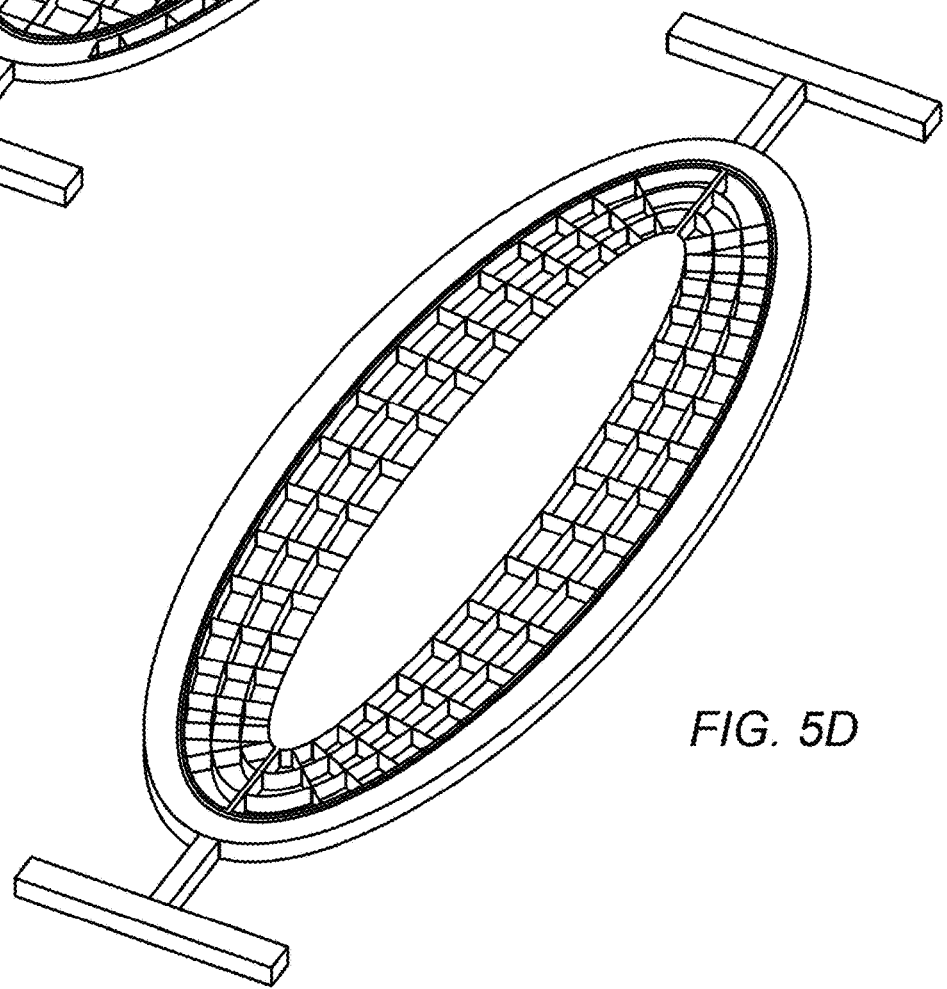
FIG. 5D shows a fifth embodiment of a support structure coupled to a backside of a MEMS-based mirror structure, according to certain embodiments.

FIG. 5D shows another embodiment of a support structure coupled to a backside of a MEMS-based mirror structure, according to certain embodiments. The circumferential and radial ridging is similar to that as shown in FIG. 4, however it does not extend to the gimbal structure. One of ordinary skill in the art with the benefit of this disclosure would appreciate the many modifications, variations, and alternative embodiments of the myriad ways of removing material from the support structure including uniform or non-uniform patterns, non-pattern arrangements (e.g., non-repeating clusters or one-off removal of silicon to create cells, ridges, etc.), Euclidian or radial configurations, ridge and/or cell pitches, and the like.

Figure 6:
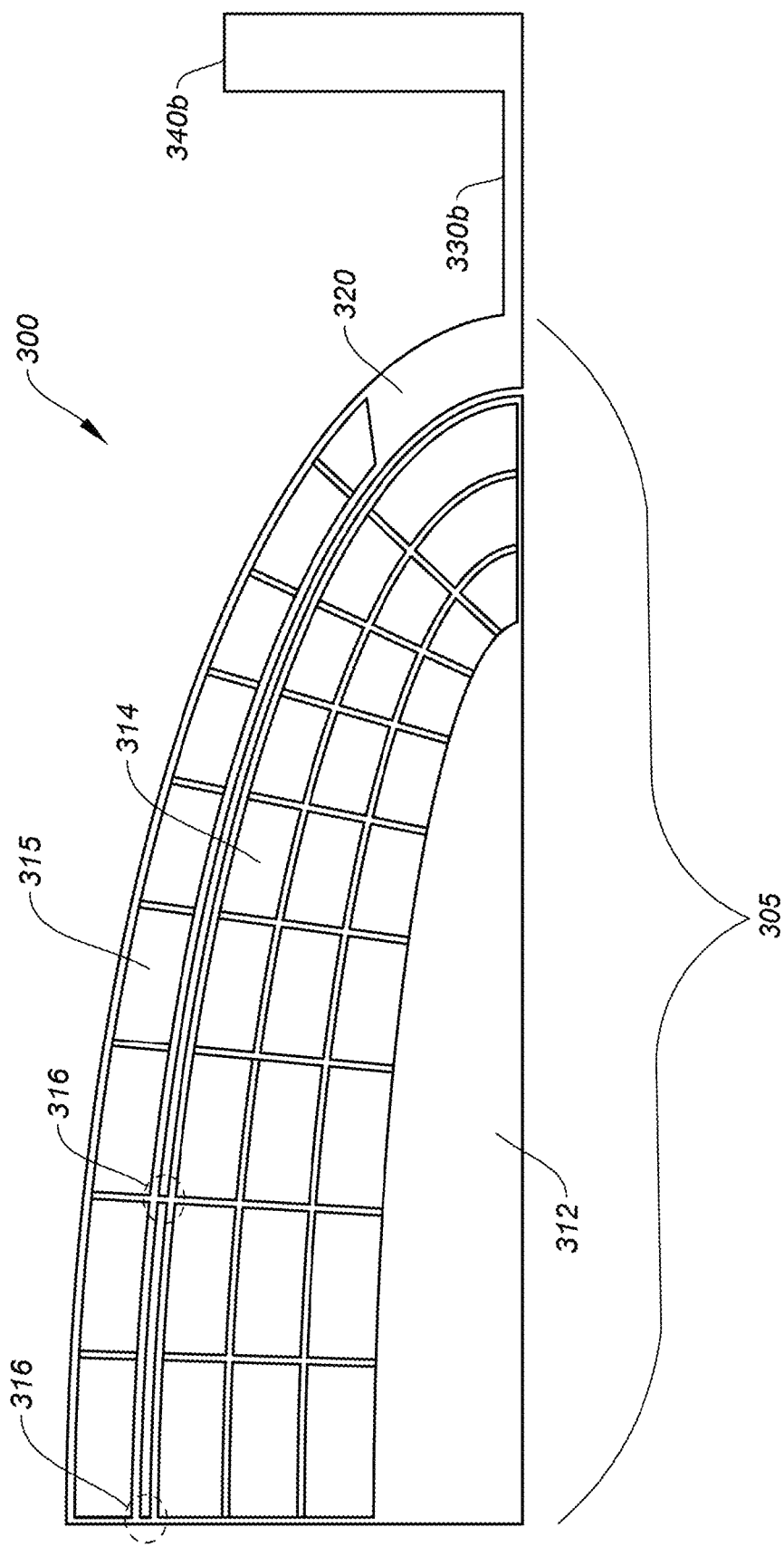
FIG. 6 shows a close up view of a quadrant of a support structure coupled to a mirror structure, according to certain embodiments.

FIG. 6 shows a close up view of a quadrant of a support structure 305 (as shown in FIG. 4) that is coupled to a mirror structure 300, according to certain embodiments. In this view, a gap between the gimbal 320 and mirror 310 can be more clearly seen, as well as the mirror-gimbal connectors 316 that provide the rotational torque that cause mirror 310 to rotate/oscillate, as described above, and the connection structures (e.g., torsion beam 330b and anchor 340b). The number and position of the mirror-gimbal connectors can have a material impact on the amount of dynamic deformation that the mirror is subject to. In some embodiments, two mirror-gimbal connectors (e.g., in each hemisphere or quadrant) can provide adequate coupling strength and can adequate reduction of dynamic deformation.

In this embodiment, the support structure 305 on the back of the gimbal includes two circumferential ridges and a plurality of radial ridges forming an array of cells 315. As described above, any number of ridges and corresponding cells may be used. Also, some embodiments may have different etching patterns, non-repeating and/or non-symmetric etched portions, or the like, but will typically include etched configurations that reduce the moment of inertia, maintain strength and stiffness, and do not contribute to any imbalance, which may occur with imbalance between hemispheres of the support structure.

The support structure 305 on the back of the mirror includes three circumferential ridges and a plurality of radial ridges forming an array of cells 314. As described above, any number of ridges and corresponding cells may be used. Some of the myriad ways to configure support structure 305 are shown in FIGS. 4-5D, although other configurations are possible, as would be appreciated by one of ordinary skill in the art with the benefit of this disclosure. Similar to the portion of the support structure on the gimbal, some embodiments may have different etching patterns, non-repeating and/or non-symmetric etched portions, or the like, but will typically include etched configurations that reduce the moment of inertia, maintain strength and stiffness, and do not contribute to any imbalance, which may occur with imbalance between hemispheres of the support structure. Typically, the support structure on the gimbal is not directly coupled to the support structure on the mirror and they operate as separate structures, although coupled embodiments are possible.

By way of example, some exemplary embodiments may include a Light Detection and Ranging (LiDAR) module for a vehicle including a semiconductor integrated circuit including a microelectromechanical system (MEMS) and a substrate, the MEMS comprising a micro-mirror assembly including a mirror and a gimbal coupled to the mirror. The gimbal can be configured concentrically around and coplanar with the mirror, as shown in FIGS. 3A-6. The gimbal and mirror structures together may be elliptical shaped, although round, rectangle, or other polygonal shapes are possible. When rotated, the gimbal can be configured to drive the mirror to oscillate at or near a resonant frequency and is coupled to the mirror via mirror-gimbal connectors. A support structure can be coupled to a backside of the mirror (and in some cases the gimbal) and configured to increase the stiffness of the mirror to help the mirror better resist dynamic deformation. To limit the added weight, the support structure can be etched, for instance, to form a matrix of cells (e.g., formed by a mesh of circumferential and radial ridges) such that at least 50% and preferably about 90% of the support structure material forming the support structure is removed due to the etching of the matrix of cells.

Figure 7A:
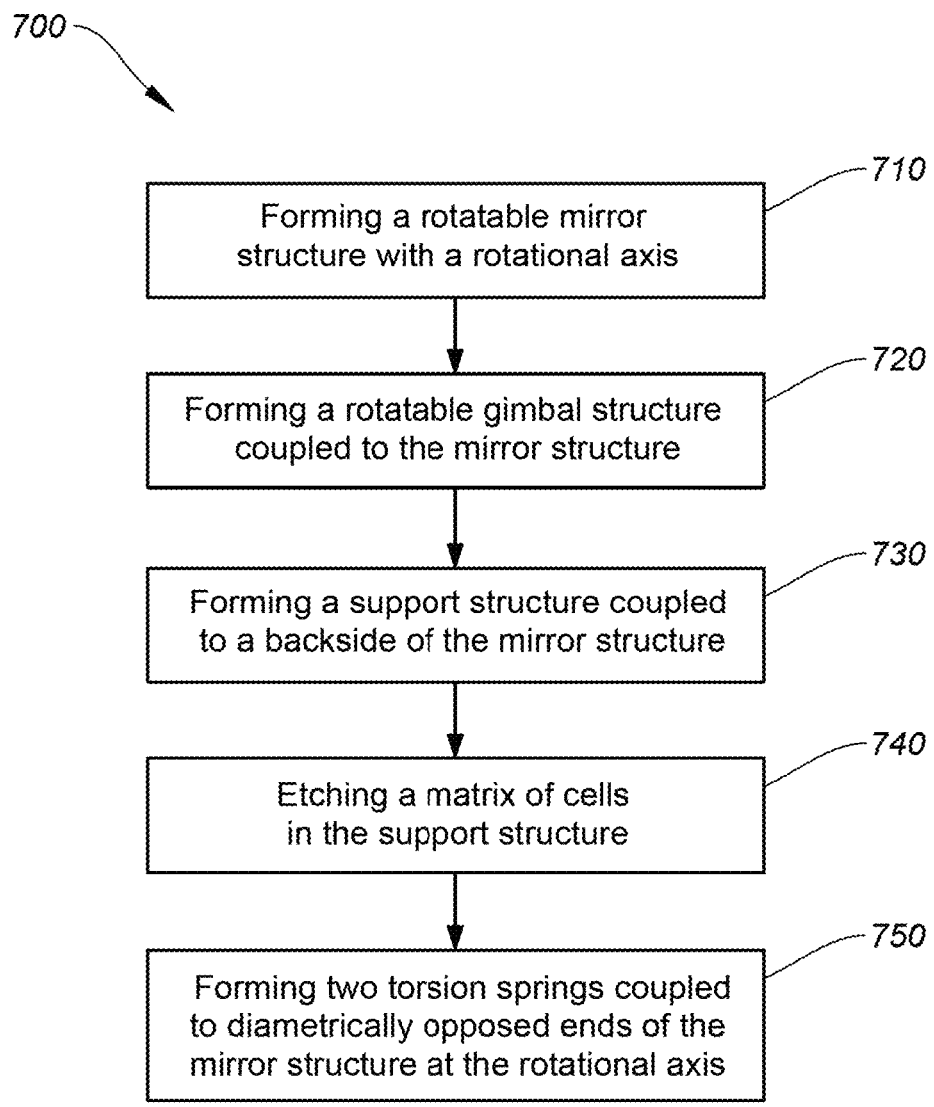
FIG. 7A is a simplified flow chart showing aspects of a method of manufacturing a MEMS-based LiDAR mirror structure with structural support, according to certain embodiments.

FIG. 7A is a simplified flow chart showing aspects of a method 700 of manufacturing a MEMS-based LiDAR mirror structure with structural support, according to certain embodiments. Although the operations of method 700 are presented in a consecutive manner with arrows leading one operation to the next, it should be understood that some or all of the operations of method 700 may be performed consecutively or simultaneously. For instance, the mirror, gimbal, and connection structure (e.g., spring) are all components of the MEMS mirror and can be formed at the same time. One of ordinary skill in the art with the benefit of this disclosure would appreciate the many modifications, variations, and alternative embodiments thereof.

At operation 710, method 700 can include forming a rotatable mirror structure, according to certain embodiments.

At operation 720, method 700 can include forming a rotatable gimbal structure coupled to the mirror structure, wherein the gimbal structure, when rotated, causes the mirror to rotate, and wherein the gimbal structure is configured concentrically around and coplanar with the mirror, according to certain embodiments.

At operation 730, method 700 can include forming a support structure coupled to a backside of the mirror, the support structure configured to increase the stiffness of the mirror, according to certain embodiments.

At operation 740, method 700 can include etching a matrix of cells in the support structure such that at least 50% of support structure material forming the support structure is removed, according to certain embodiments.

At operation 750, method 700 can include forming two torsion springs coupled to diametrically opposed ends of the mirror structure, wherein the torsion springs are configured to apply a rotational force that causes the mirror to rotate at or near a resonant frequency, according to certain embodiments.

It should be appreciated that the specific steps illustrated in FIG. 7A provide a particular method 700 for manufacturing a MEMS-based LiDAR mirror structure with structural support, according to certain embodiments. Other sequences of steps may also be performed according to alternative embodiments. Furthermore, additional steps may be added or removed depending on the particular applications. For example, method 700 may further include forming a second support structure coupled to a backside of the gimbal structure, the second support structure configured to increase the stiffness of the gimbal structure, and etching a matrix of cells in the second support structure such that at least 50% of second support structure material forming the second support structure is removed. Any combination of changes can be used and one of ordinary skill in the art with the benefit of this disclosure would understand the many variations, modifications, and alternative embodiments thereof.

Figure 7B:
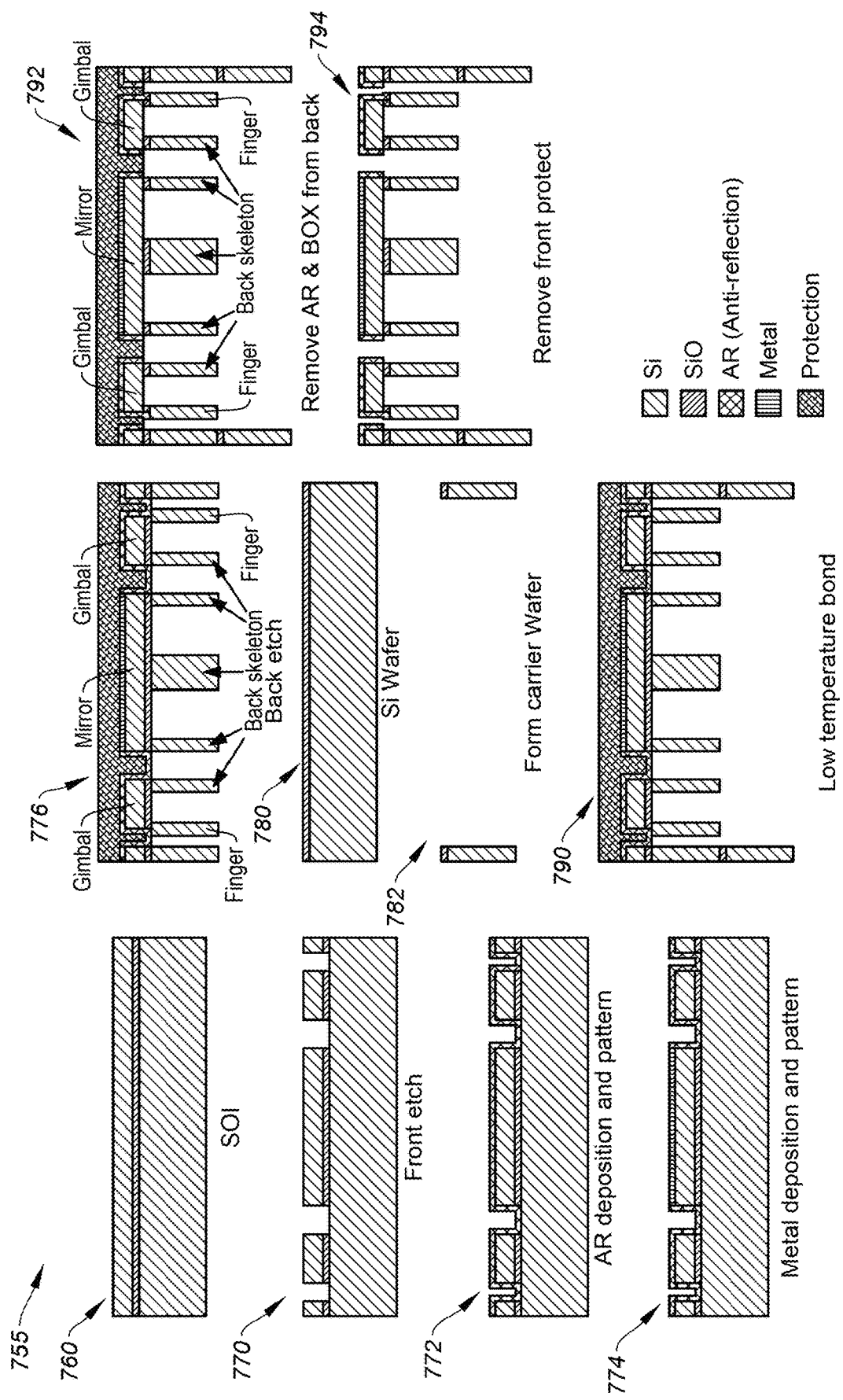
FIG. 7B is a simplified flow chart showing a typical process flow for manufacturing a MEMS-based LiDAR mirror structure with structural support, according to certain embodiments.

FIG. 7B is a simplified flow chart showing a typical process flow 755 for manufacturing a MEMS-based LiDAR mirror structure with structural support, according to certain embodiments. Process flow 755 is shown as a cross-sectional view and can correspond to the various operations of method 700, as would be appreciated by one of ordinary skill in the art with the benefit of this disclosure, and as further described in U.S. patent application Ser. No. 16/905,254, filed on Jun. 18, 2020, which is herein incorporated by reference in its entirety for all purposes.

At operation 760, process flow 755 can include forming silicon-on-insulator (SOI) structure, according to certain embodiments. The insulator layer is typically sandwiched between silicon layers, with the upper silicon layer (the "front" side of the wafer) to be etched to form the various elements of the mirror structure (e.g., the mirror, gimbal, connection structures, etc.), and the lower silicon layer (the "back" side of the wafer) to be etched to form the support structure. In some embodiments, the insulator may electrically isolate the upper silicon layer from the lower silicon layer.

At operation 770, process flow 755 can include front etching the upper silicon layer to form isolated regions that will make up the various elements of the mirror structure (e.g., mirror, gimbal, connection structures, etc.), as would be appreciated by one of ordinary skill in the art with the benefit of this disclosure. The upper SOI layer is typically 80 μm to 200 μm, although other dimensions are possible.

At operation 772, process flow 755 can include an anti-reflection (AR) deposition and patterning process(es), according to certain embodiments. The AR deposition can prevent unintended reflections of light pulses off of features that are not meant to perform light steering operations (e.g., connection structures, gimbal, anchor structures, etc.), as would be appreciated by one of ordinary skill in the art with the benefit of this disclosure.

At operation 774, process flow 755 can include metal deposition and patterning process(es), according to certain embodiments. Metal deposition can be used to form a substantially and uniformly flat reflective surface, which can be etched to include the mirror and to exclude other features (e.g., gimbal, connection structures, anchor structures, etc.), as would be appreciated by one of ordinary skill in the art with the benefit of this disclosure. The upper (front) portion of the SOI is typically called the "device" layer.

At operation 776, process flow 755 can include a back etch process that forms the structural support ("back skeleton"), as shown for example in FIG. 4. The structural support can operate to increase the stiffness of the mirror with a relatively small increase in mass, which can both reduce the moment of inertia of the rotating mirror and reduce dynamic deformation. Some examples of MEMS-based mirror structures that utilize a support structure are shown, for example, in FIGS. 4-6. The structural support is shown as a simplified cross-section of etched portions that can form a number of circumferential and radial ridges that form cells, as described above. A protection layer may be deposited that can operate to temporarily protect the various elements of the device layer elements during handling and processing, but can be removed (e.g., etched away) at a later stage when processing is complete. The protection layer is typically about 100 μm to 300 μm although other ranges are possible, according to certain embodiments.

At operation 780, process flow 755 can include forming another SOI wafer and etching it to form a "form carrier wafer" (process flow 782), according to certain embodiments.

At operation 790, process flow 755 can include bonding (e.g., via a low temperature bond) the form carrier wafer to the lower silicon layer (structural support layer), according to certain embodiments.

At operation 792, process flow 755 can include removing AR and buried oxide layer (e.g., of electrically insulating $SiO_2$ called "BOX") from the lower silicon layer, which can expose the back skeleton.

At operation 794, process flow 755 can include removing the protection layer from the upper silicon layer, according to certain embodiments.

It should be appreciated that the specific steps illustrated in FIG. 7B provide a particular process flow 755 for manufacturing a MEMS-based LiDAR mirror structure with structural support, according to certain embodiments. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

MEMS Micro-Mirror Structure with Multiple Comb Spines

In a typical MEMS-based micro-mirror assembly, each micro-mirror may be supported by one or more connection structures (e.g., torsion springs; typically two per axis of rotation), which can operate as a pivot/connection point and may be anchored to a substrate, as described above. To help mitigate dynamic deformation, a gimbal may be configured between the micro-mirror and torsion spring. In some embodiments, a thicker mirror can increase the mirror's stiffness, which can mitigate dynamic deformation, but may add a large rotation moment of inertia, which can ultimately require a larger driving force on the connection structures to maintain a constant rotation angle of the micro-mirror. Electrostatic actuation may be used (e.g., using comb drive structures) to drive the rotation of the micro-mirror, and embodiments of the present invention are directed to providing an increased electrostatic force to accommodate the larger rotational moment of inertia found on heavier mirrors. Some embodiments may employ additional comb electrodes configured on the periphery of a mirror structure to add an available electrostatic force to supplement rotational torque. However, even embodiments that utilize all available surface area (e.g., FIG. 8) on the periphery of the mirror/gimbal structure may still yet produce insufficient electrostatic force to achieve a sufficient deflection (FOV) at a target resonant frequency. Thus, exemplary embodiments of aspects of the invention (e.g., FIG. 10) are directed to a MEMS mirror structure (e.g., gimbaled or not gimbaled) that contains multiple comb spines protruding parallel to the axis of rotation, with each including a number of comb electrodes, which operate to effectively increase the amount of area that can accommodate comb drive elements (e.g., comb electrodes), thereby substantially increasing an amount of available electrostatic force to rotate the one or more micro-mirrors.

Figure 8:
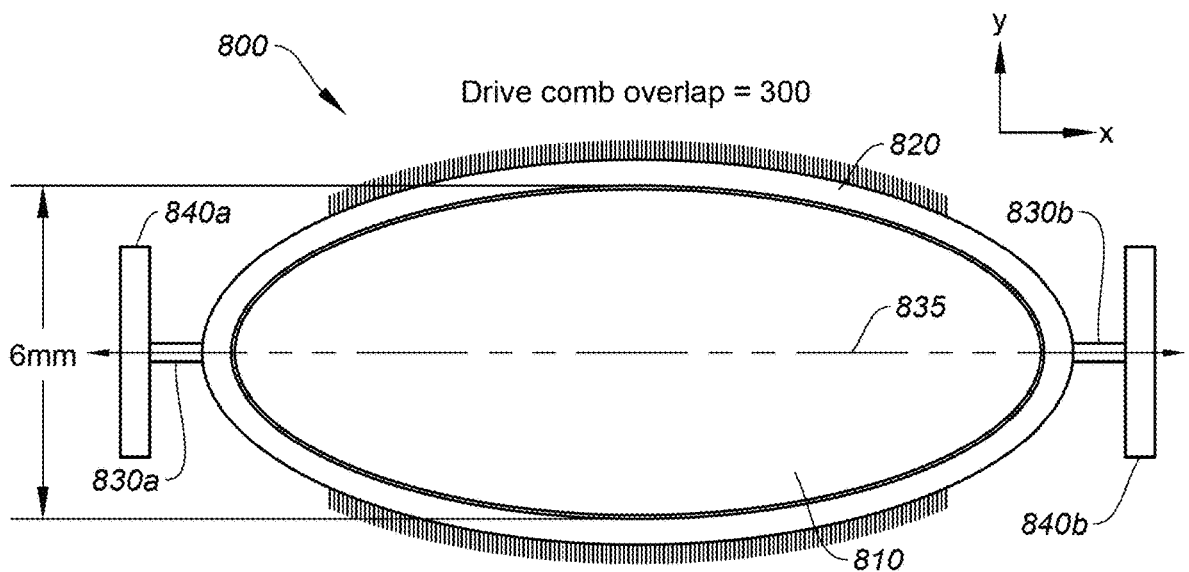
FIG. 8 shows a mirror assembly and relative dimensions, according to certain embodiments.

FIG. 8 shows a mirror assembly 800 and relative dimensions, according to certain embodiments. Mirror assembly 800 can include a mirror 810, gimbal structure 820, connection structures 830a, 830b, and anchor structures 840a, 840b. Gimbal 820 may be coupled to mirror 810 by one or more mirror-gimbal connectors (not shown). Mirror assembly 800 may be similar in structure and operation to mirror assembly 300, with or without the support structure coupled to the backside, as shown and described above with respect to FIGS. 4-6. Mirror assembly 800 may be wholly comprised of any suitable silicon-based semiconductor. The specific embodiment of FIG. 8 is an elliptical mirror/gimbal structure ("mirror structure"), which can be formed in any suitable shape and corresponding dimensions (e.g., 6 mm×15 mm as shown). The addition of the gimbal may substantially increase the rotational moment of inertia, which may require an increased torsion spring stiffness. In conventional embodiments with a single torsion spring comb drive coupled to the torsion springs, the resulting electrostatic force generated by the comb drive array may not be large enough to drive the mirror structure into oscillation. Some improved embodiments may further employ an array of comb electrodes 850 configured to protrude normal and co-planar with the outer surface of the gimbal that can operate to provide a greater electrostatic force (e.g., the embodiment of FIG. 8). FIG. 8 shows a comb drive overlap of approximately 300). Some embodiments may be configured to utilize as much surface area on the periphery of the gimbal as possible to maximize the generated force. However, despite the increase in available electrostatic force provided by the additional gimbal comb electrodes, the resulting electrostatic force generated by the additional comb drive array may still not be large enough to drive the mirror structure into oscillation, as shown and described below with respect to FIG. 9.

Figure 9:
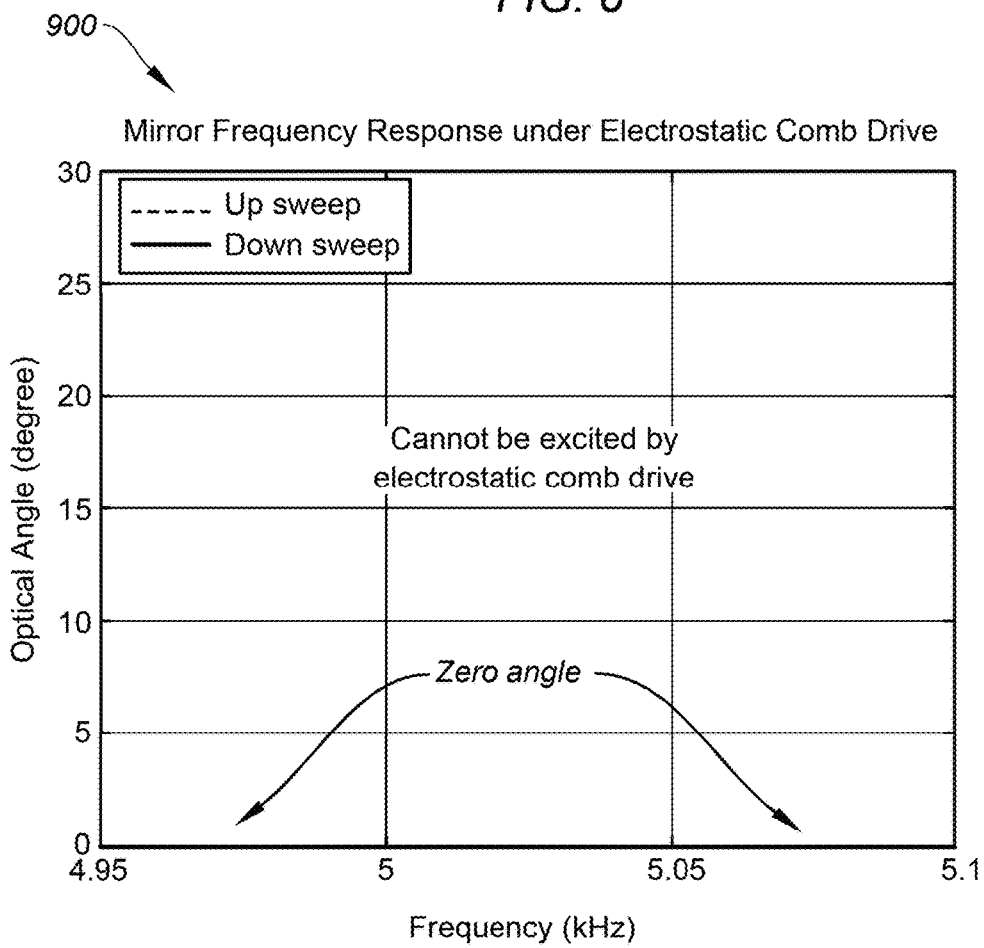
FIG. 9 is a graph showing a MEMS mirror structure frequency response under operation by an electrostatic comb drive, according to certain embodiments.

FIG. 9 is a graph 900 showing a MEMS mirror structure frequency response under operation by an electrostatic comb drive in some embodiments of mirror assembly 800. The x-axis shows frequency (kHz) and the y-axis shows the optical angle of deflection (in degrees). The oscillation of the various micro-mirror assemblies described herein can be described in terms of an up sweep (increasing frequency from low-to-high) and a down sweep (decreasing frequency from high-to-low), represented as dashed and solid lines, respectively. As shown in FIG. 9, the system attempts to sweep the comb drive at or near the natural (resonant) frequency of the mirror structure, but no oscillation occurs (e.g., there is a zero deflection angle) because the rotational moment of inertia is too large for the comb drive, even in improved embodiments with comb electrodes configured along the entire periphery of the gimbal (or mirror in non-gimbaled structures).

Figure 10:
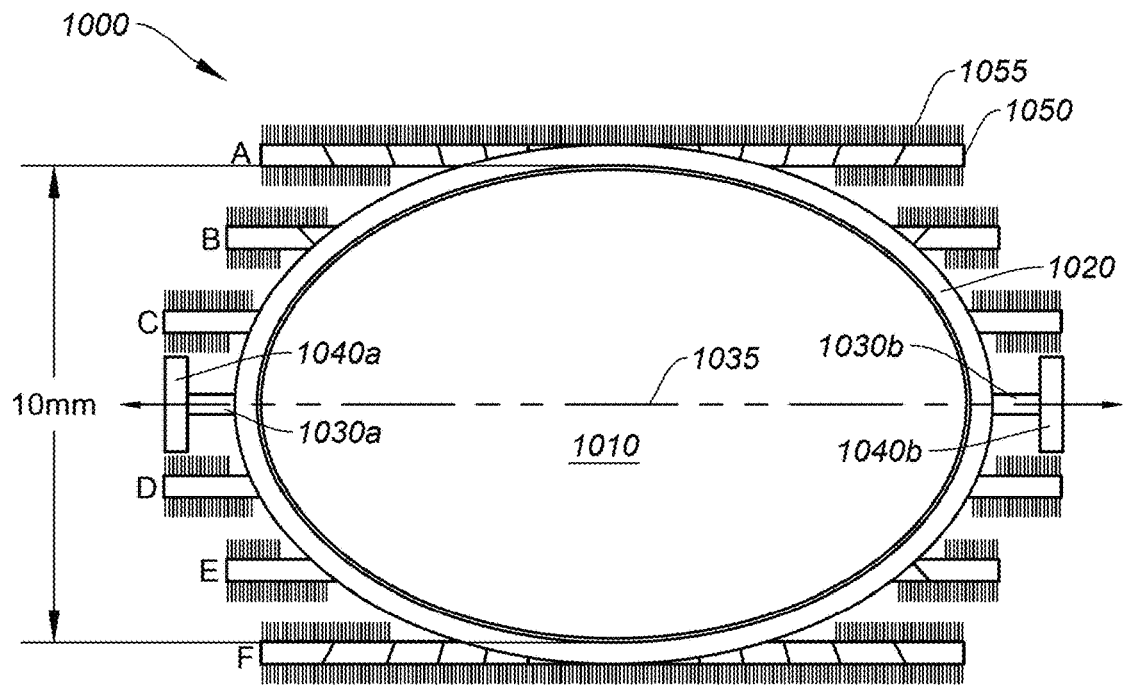
FIG. 10 shows an improved MEMS mirror assembly with a plurality of electrostatic comb drives, according to certain embodiments.

FIG. 10 shows an improved MEMS mirror assembly 1000 with a plurality of electrostatic comb drives, according to certain embodiments. Mirror assembly 1000 can include a mirror 1010, gimbal 1020, connection structures 1030a, 1030b, and anchor structures 1040a, 1040b. Gimbal 1020 may be coupled to mirror 1010 by one or more mirror-gimbal connectors (not shown). Mirror assembly is shown as a 10 mm×15 mm elliptical mirror/gimbal structure. The large mirror size (larger than the mirror structure of FIG. 8) and the addition of a gimbal may substantially increase the rotational moment of inertia and an increased torsion spring stiffness, as described above. As noted above, even embodiments that employ an array of comb electrodes configured along the gimbal may not produce enough electrostatic force to achieve a target FOV and resonant frequency for mirror assembly 1000. To increase the effective available area to employ co-planar electrodes to mirror structure 1000, a plurality of comb spine structures 1050 and corresponding comb electrodes 1055 (forming additional comb drives) can be added, as shown in FIG. 10. Six rows of comb spines (labeled "A"-"F") are shown, with each row including a comb spine protruding from the gimbal structure in a direction parallel to the axis of rotation and coplanar with the mirror structure. The additional comb drives may produce enough additional electrostatic force to rotate the mirror structure at the target FOV and resonant frequency.

Figure 11:
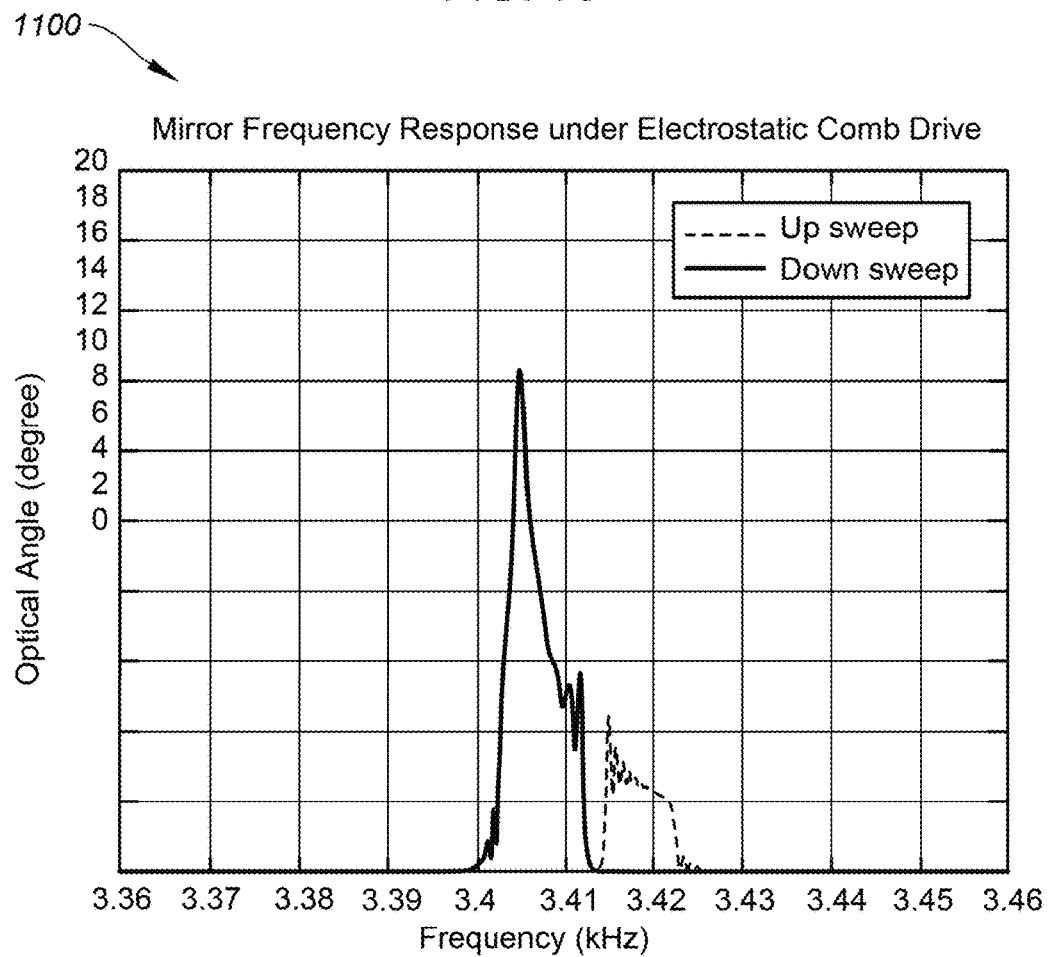
FIG. 11 is a graph showing a MEMS mirror structure frequency response under operation by multiple electrostatic comb drives, according to certain embodiments.

FIG. 11 is a graph 1100 showing a MEMS mirror structure frequency response under operation by multiple electrostatic comb drives, according to certain embodiments. The x-axis shows frequency (kHz) and the y-axis shows the optical angle of deflection (in degrees). As shown in FIG. 11, the system sweeps the multiple comb drives at or near the natural (resonant) frequency of the mirror structure and the mirror structure is excited to oscillate with an up sweep occurring over approximately 3.41 kHz to 3.43 kHz, and a down sweep of approximately 3.41 kHz to 3.4 kHz. Thus, a sufficient electrostatic force can be provided by the inclusion of additional comb drives provided by the comb spines and corresponding comb electrodes, as further shown and described below with respect to FIG. 12.

Figure 12:
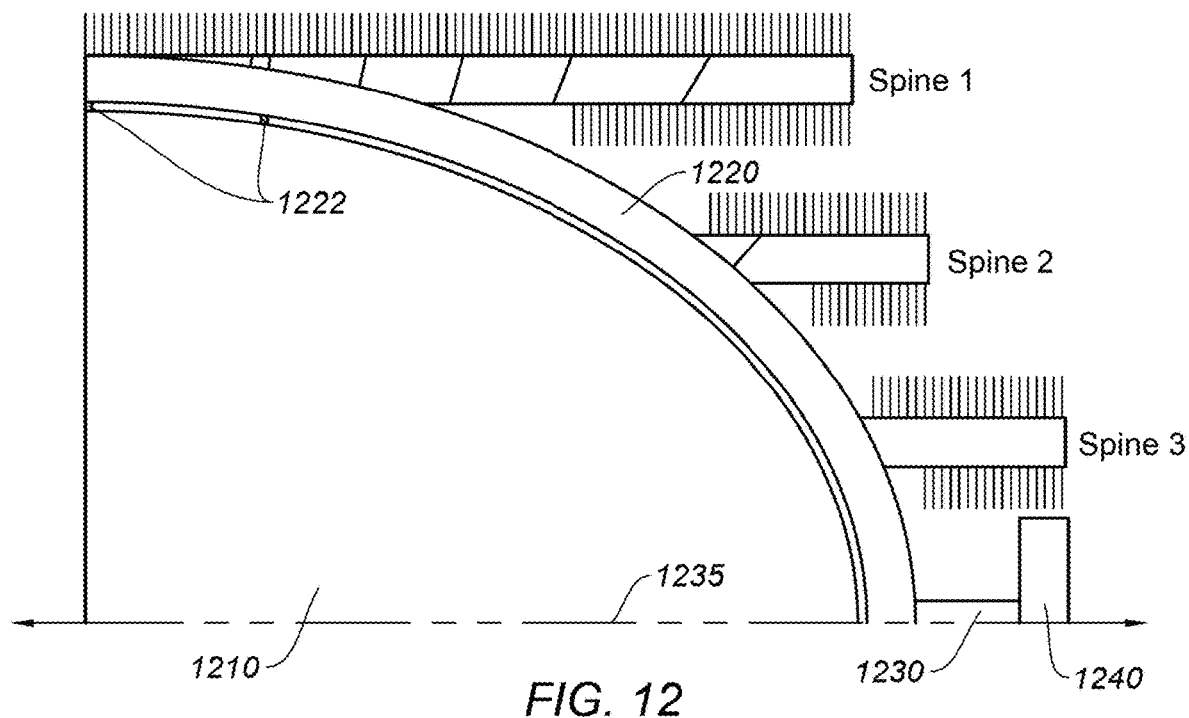
FIG. 12 shows a close-up view of a quarter symmetry illustration of a MEMS mirror assembly with a plurality of electrostatic comb drives, according to certain embodiments.

FIG. 12 shows a close-up view of a quarter symmetry illustration of a MEMS mirror assembly 1200 with a plurality of electrostatic comb drives, according to certain embodiments. Mirror assembly 1200 can include a mirror 1210, gimbal 1220, connection structures 1230, and anchor structures 1240. Gimbal 1220 may be coupled to mirror 1210 by one or more mirror-gimbal connectors 1222. Mirror assembly 1200 may be similar to mirror assembly 1000, but is shown in an enlarged representation to better depict aspects of the invention.

Three sets of comb spines are shown (e.g., shown as spines 1-3), however the embodiments of FIGS. 10 and 12 include twelve comb spines in total, with three on each symmetric quadrant. However, any number of comb spines can be used, as would be appreciated by one of ordinary skill in the art with the benefit of this disclosure. The comb spines typically protrude longitudinally from the mirror or gimbal at an angle parallel to the axis of rotation of the mirror structure, although other angles may be used. Comb spines are typically co-planar or substantially coplanar to the mirror structure and may be comprised of a solid or hollow construction. Comb spines are typically not collinear with the axis of rotation of the mirror. Typically, comb spines protrude from the mirror or gimbal at diametrically opposed locations from the mirror structure that are equidistant from the axis of rotation, as shown for example in each pair of comb spines on each of rows A-F in FIG. 10, although other configurations of comb spines are possible. One of ordinary skill in the art with the benefit of this disclosure would appreciate the many modifications, variations, and alternative embodiments thereof.

In certain embodiments, the comb spines include a number of comb electrodes that typically protrude from their corresponding comb spine at an angle normal (perpendicular) to the comb spine, although other angles are possible. Comb electrodes typically protrude above (e.g., 90 degrees relative to the longitudinal extension of the comb spine) and/or below (e.g., -90 degrees relative to the longitudinal extension of the comb spine). The number of comb electrodes on each spine can be configured based on a corresponding rotational torque requirement. In exemplary embodiments, the number of spines, the strength of the spines (e.g., hollow or solid), the number of electrodes, etc., are configured such that the corresponding mirror structure can oscillate at the desired FOV and resonant frequency, the comb electrodes have sufficient mechanical support, and the additional rotational moment of inertia added due to the additional comb drives (e.g., comb spine and comb electrodes) is minimized or kept sufficiently low. One of ordinary skill in the art with the benefit of this disclosure would appreciate the many modifications, variations, and alternative embodiments thereof.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A Light Detection and Ranging (LiDAR) module for a vehicle, the LiDAR module comprising:
   a semiconductor integrated circuit including a microelectromechanical system (MEMS) and a substrate, the MEMS comprising a micro-mirror assembly including:
   a mirror;
   a gimbal coupled to the mirror,
      wherein the gimbal is configured concentrically around and coplanar with the mirror, and
      wherein when rotated, the gimbal drives the mirror to oscillate at approximately a resonant frequency; and
   a support structure coupled to a backside of the mirror, the support structure configured to increase a stiffness of the mirror, the support structure being etched to form a matrix of cells such that at least 50% of support structure material forming the support structure is removed.

2. The LiDAR module of claim 1 wherein a second support structure is coupled to a backside of the gimbal, the second support structure configured to increase the stiffness of the gimbal, the second support structure being etched to form a second matrix of cells such that at least 50% of second support structure material is removed.

3. The LiDAR module of claim 1 wherein each of the cells have a pitch between 100 μm-800 μm.

4. The LiDAR module of claim 1 wherein the support structure is etched such that between 50%-90% of the support structure material is removed.

5. The LiDAR module of claim 1 wherein the mirror and the gimbal form an elliptical structure.

6. The LiDAR module of claim 1 wherein the matrix of cells of the support structure include a plurality of circumferential and radial ridges.

7. The LiDAR module of claim 1 further comprising at least two torsion springs coupled to diametrically opposed ends of the gimbal, wherein the torsion springs are configured to apply a rotational force that causes the gimbal to rotate at the resonant frequency.

8. The LiDAR module of claim 1 wherein the mirror and the support structure are shaped as an ellipse having a center point and an outer edge, wherein a center region of the support structure is not etched, and wherein the center region is defined by a concentric ellipse with a radius at each point along an outer edge of the concentric ellipse that is less than 50% of a distance between the center point and the outer edge of the mirror.

9. An apparatus comprising:
a semiconductor integrated circuit including a microelectromechanical system (MEMS) and a substrate, the MEMS comprising a micro-mirror assembly including:
a mirror; and
a support structure forming a backside of the mirror, the support structure configured to increase a stiffness of the mirror, the support structure including cutaway portions forming a pattern such that at least 50% of support structure material forming the support structure is removed,
wherein the pattern includes a plurality of cells each having a pitch between 100 μm-800 μm.

10. The apparatus of claim 9 further comprising at least two torsion springs coupled to diametrically opposed ends of the mirror, wherein the torsion springs are configured to apply a rotational force that causes the mirror to rotate at approximately a resonant frequency.

11. The apparatus of claim 9 wherein the support structure is cutaway such that between 50%-90% of the support structure material is removed.

12. The apparatus of claim 9 wherein the mirror is formed as an elliptical structure.

13. The apparatus of claim 9 wherein the pattern on the support structure includes a plurality of circumferential and radial ridges.

14. A method for forming a semiconductor integrated circuit including a microelectromechanical system (MEMS) and a substrate, the method comprising:
forming a rotatable mirror structure;
forming a rotatable gimbal structure coupled to the mirror structure, wherein the gimbal structure, when rotated, causes the mirror to rotate, and wherein the gimbal structure is configured concentrically around and coplanar with the mirror;
forming a support structure coupled to a backside of the mirror, the support structure configured to increase a stiffness of the mirror; and
etching a matrix of cells in the support structure such that at least 50% of support structure material forming the support structure is removed.

15. The method of claim 14 further comprising:
forming two torsion springs coupled to diametrically opposed ends of the mirror structure, wherein the torsion springs are configured to apply a rotational force that causes the mirror to rotate at approximately a resonant frequency.

16. The method of claim 14 wherein each cell in the matrix of cells has pitch between 100 μm-800 μm.

17. The method of claim 14 wherein the support structure is etched such that between 50%-90% of the support structure material is removed.

18. The method of claim 14 wherein the mirror and gimbal form an elliptical structure.

19. The method of claim 14 further comprising:
forming a second support structure coupled to a backside of the gimbal structure, the second support structure configured to increase a stiffness of the gimbal structure; and
etching a matrix of cells in the second support structure such that at least 50% of second support structure material forming the second support structure is removed.

20. An apparatus comprising:
a semiconductor integrated circuit including a microelectromechanical system (MEMS) and a substrate, the MEMS comprising a micro-mirror assembly including:
a mirror; and
a support structure coupled to a backside of the mirror and configured to increase a stiffness of the mirror, the support structure including cutaway portions such that at least 50% of support structure material forming the support structure is removed,
wherein the support structure includes pattern comprised of a plurality of circumferential and radial ridges.

* * * * *